US010980107B2

(12) United States Patent
Uchimura

(10) Patent No.: US 10,980,107 B2
(45) Date of Patent: Apr. 13, 2021

(54) ELECTROMAGNETIC BLOCKING STRUCTURE, DIELECTRIC SUBSTRATE, AND UNIT CELL

(71) Applicant: KYOCERA Corporation, Kyoto (JP)

(72) Inventor: Hiroshi Uchimura, Kagoshima (JP)

(73) Assignee: KYOCERA CORPORATION, Kyoto (JP)

( * ) Notice: Subject to any disclaimer, the term of this patent is extended or adjusted under 35 U.S.C. 154(b) by 400 days.

(21) Appl. No.: 15/618,080

(22) Filed: Jun. 8, 2017

(65) Prior Publication Data

US 2018/0007784 A1 Jan. 4, 2018

(30) Foreign Application Priority Data

Jun. 30, 2016 (JP) .............................. JP2016-131124
May 23, 2017 (JP) .............................. JP2017-101372

(51) Int. Cl.
*H05K 1/02* (2006.01)
*H01Q 1/52* (2006.01)
*H01Q 15/00* (2006.01)
*H05K 9/00* (2006.01)

(52) U.S. Cl.
CPC .......... *H05K 1/0224* (2013.01); *H01Q 1/526* (2013.01); *H01Q 15/0013* (2013.01); *H01Q 15/0026* (2013.01); *H05K 9/0081* (2013.01); *H05K 1/0298* (2013.01); *H05K 2201/09263* (2013.01)

(58) Field of Classification Search
CPC ............. H01Q 15/006; H01Q 15/0013; H01Q 15/0026; H01Q 15/0093; H01Q 15/14; H01Q 1/52; H01Q 1/526; H05K 1/0224
See application file for complete search history.

(56) References Cited

U.S. PATENT DOCUMENTS

| | | | | |
|---|---|---|---|---|
| 6,483,481 B1 * | 11/2002 | Sievenpiper | ......... | H01Q 15/008 343/700 MS |
| 6,512,494 B1 * | 1/2003 | Diaz | ....................... | H01Q 7/00 343/842 |
| 7,071,889 B2 * | 7/2006 | McKinzie, III | ...... | H01Q 9/0421 343/700 MS |
| 9,099,764 B2 * | 8/2015 | Sasaki | ..................... | H01P 1/212 |
| 2001/0028328 A1 * | 10/2001 | Stjernman | ................ | H01Q 3/46 343/761 |

(Continued)

OTHER PUBLICATIONS

Murakami et al., "Low-Profile Design and Bandwidth Characteristics of Artificial Magnetic Conductor with Dielectric Substrate", IEICE Transactions on Communications, Feb. 1, 2015, vol. J98-B, No. 2, pp. 172-179.

(Continued)

*Primary Examiner* — Dameon E Levi
*Assistant Examiner* — Jennifer F Hu
(74) *Attorney, Agent, or Firm* — Hauptman Ham, LLP

(57) ABSTRACT

An electromagnetic blocking structure includes a dielectric substrate with at least one conductor layer in the dielectric substrate, the at least one conductor layer has a plurality of first unit cells of a first type without four-fold symmetry, and a plurality of second unit cells of the first type, the plurality of first unit cells and the plurality of second unit cells are arranged in a grid pattern with each first unit cell among the plurality of first unit cells being oriented substantially 90° relative to each second unit cell among the plurality of second unit cells.

2 Claims, 42 Drawing Sheets

(56) References Cited

U.S. PATENT DOCUMENTS

| | | | | |
|---|---|---|---|---|
| 2003/0137457 A1* | 7/2003 | McKinzie, III | ...... | H01Q 9/0421 343/700 MS |
| 2003/0142036 A1* | 7/2003 | Wilhelm | .................. | H01Q 1/36 343/909 |
| 2003/0214456 A1* | 11/2003 | Lynch | ................ | H01Q 15/0026 343/909 |
| 2006/0044210 A1* | 3/2006 | Ramprasad | .......... | H01Q 15/008 343/909 |
| 2006/0092079 A1* | 5/2006 | de Rochemont | .... | H01Q 15/006 343/700 MS |
| 2009/0201220 A1* | 8/2009 | Kim | ..................... | H01Q 15/006 343/907 |
| 2010/0214178 A1* | 8/2010 | Toyao | ..................... | H01P 3/003 343/702 |
| 2011/0115684 A1* | 5/2011 | Greegor | .................. | H01P 1/207 343/776 |
| 2018/0017664 A1* | 1/2018 | Toyao | ........................ | G01S 7/03 |
| 2019/0036225 A1* | 1/2019 | Kosaka | ..................... | G01S 7/03 |

OTHER PUBLICATIONS

Hayashi et al., "Reflection Characteristic of a Metal Plate Loaded FSR Using an Equivalent Circuit Model and Its Application to the AMC Substrate", IEICE Transactions on Communications, Sep. 1, 2013, vol. J96-B, No. 9, pp. 1010-1018.

* cited by examiner

Fig. 12(a)
Fig. 12(b)
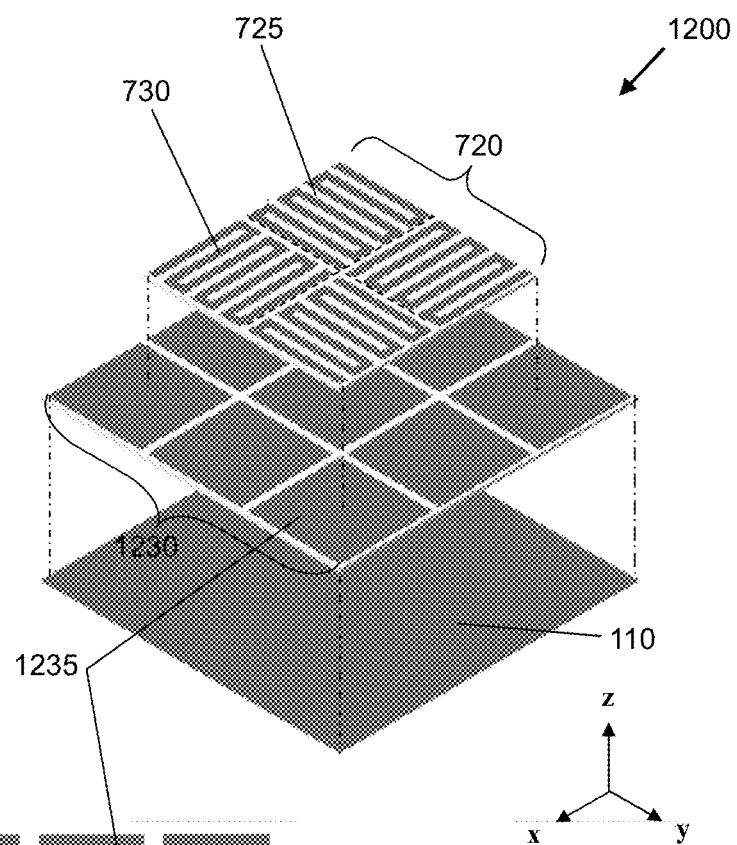
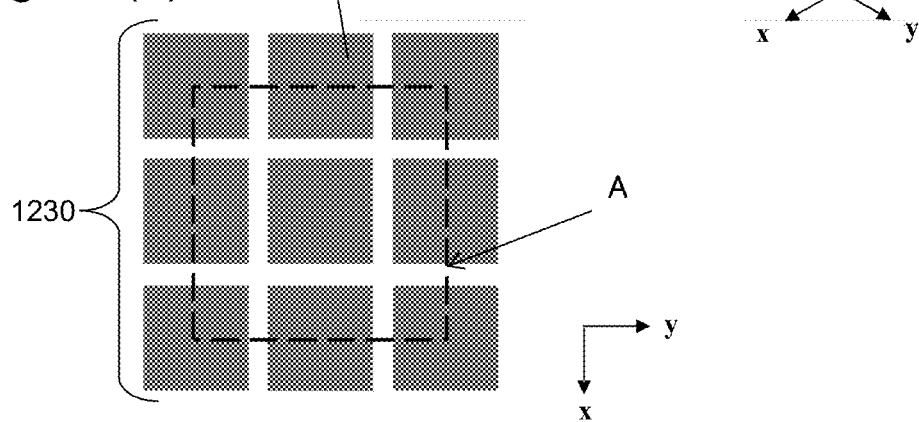

ELECTROMAGNETIC BLOCKING STRUCTURE, DIELECTRIC SUBSTRATE, AND UNIT CELL

RELATED APPLICATION

The present application claims priority to Japanese Application Numbers 2016-131124, filed Jun. 30, 2016, and 2017-101372, filed May 23, 2017, the disclosures of which are hereby incorporated by reference herein in their entireties.

TECHNICAL FIELD

The present disclosure relates generally to the field of electromagnetic interference blocking/shielding, and in particular to an electromagnetic (EM) blocking structures, dielectric substrates having EM blocking properties, and unit cell structures having EM blocking properties.

BACKGROUND

Recently, the market for the "Internet of Things" has grown. Devices that historically were not designed for being connected to a network and/or the internet, for example, home appliances, wristwatches, automobiles, etc., are increasingly being manufactured with networking communications hardware to enable these devices to connect to the internet and/or other types of data networks. Further, many of these devices are connecting via wireless connections. Murakami et al., "Low Profile Design and Bandwidth Characteristics of Artificial Magnetic Conductor with Dielectric Substrate" Shingakuron (B) Vol. J 98-B No. 2, pp. 172-179 describes a system for block electromagnetic (EM) interference. Devices which use lower power for signal transmission experience a greater impact from EM interference because the EM interference is proportionally higher for these devices than for devices which utilize a higher power for signal transmission. Reducing the EM interference allows for greater range and signal quality for the networked devices, regardless of a power level for signal transmission.

Various EM blocking devices and substrates have been proposed for miniaturization. For example, attempts have been made to reduce the size of artificial magnetic conductors (AMCs) which have a regular pattern of patch-type unit cells. In these devices, each patch-type unit cell has a size equal to a resonator wavelength k. Murakami, mentioned above, includes films having patterns of loop structures and loop-slot structures. The unit cell size in Murakami is λ/4.

When a plane wave enters a metal conductor, the wave is reflected, and the phase of the reflected wave is shifted by 180°. This is generally referred to as an electric wall. If the metal conductor is near an antenna, an electromagnetic wave radiated from the antenna and the electromagnetic wave reflected by the metal conductor will effectively blocking the signal from the antenna due to destructive interference. In order to avoid this phenomenon, the distance between the antenna and the metal conductor is set to λ/4, in some instances. However, this increased distance results in an increase in the thickness of the antenna substrate. In addition to the above phenomenon, if a plane wave enters a magnetic body, reflection can with a phase shift of 0° rather than 180°.

Hayashi et al., "Reflection Characteristic of a Metal Plate Loaded FSR Using an Equivalent Circuit Model and Its Application to the AMC Substrate" Shingakuron (B), Vol. J 96-B No. 9, pp. 1010-1018; described metamaterial that are able to block EM interference by controlling a phase of a reflected plane wave to change from −90° to 90°.

BRIEF DESCRIPTION OF THE DRAWINGS

The present disclosure can be understood from the following detailed description when read with the accompanying figures. Unless otherwise specified, various features are not drawn to scale and are used for illustration purposes only. Moreover, the dimensions of various features may be increased or decreased for clarity purposes.

FIG. 12 (a) is a perspective view of an exemplary electromagnetic blocking structure in accordance with some embodiments.

FIG. 12 (b) is a plan view of a conductor layer of FIG. 12 (a) in accordance with some embodiments.

FIG. 16 (b) is a cross-sectional view taken along the section line B-B' of the exemplary electromagnetic blocking structure of FIG. 16 (a) in accordance with some embodiments.

FIG. 18 (b) is a plan view of an exemplary electromagnetic blocking structure in accordance with some embodiments.

FIG. 19 (b) is a plan view of an exemplary electromagnetic blocking structure in accordance with some embodiments.

FIG. 20 (b) is a plot of reflection phase versus frequency for the exemplary electromagnetic blocking structure according to FIG. 1 in which the first and second conductor layers are each uniform layers of serpentine unit cells in accordance with some embodiments.

FIG. 21 (b) is a plot of reflection phase versus frequency for an exemplary electromagnetic blocking structure according to FIG. 1 in which the first and second conductor layers are each uniform layers of point symmetric double spiral unit cells in accordance with some embodiments.

FIG. 22 (b) is a plot of reflection phase versus frequency for an exemplary electromagnetic blocking structure according to FIG. 8 in which the first and second conductor layers are each uniform layers of serpentine unit cells in accordance with some embodiments.

FIG. 23 (b) is a plot of reflection phase versus frequency for an exemplary electromagnetic blocking structure according to FIG. 8 in which the first and second conductor layers are each uniform layers of point symmetric double spiral unit cells in accordance with some embodiments.

FIG. 24 (b) is a plot of reflection phase versus frequency for an exemplary electromagnetic blocking structure according to FIG. 8 in which the first and second conductor layers are each uniform layers of line symmetric double spiral unit cells in accordance with some embodiments.

FIG. 25 (b) is a plot of reflection phase versus frequency for an exemplary electromagnetic blocking structure according to FIG. 8 in which the first and second conductor layers are each uniform layers of serpentine unit cells, and the patch layer is a uniform layer of loop structure unit cells in accordance with some embodiments.

FIG. 26 (b) is a plot of reflection phase versus frequency for an exemplary electromagnetic blocking structure according to FIG. 8 in which the first and second conductor layers are each uniform layers of serpentine unit cells, and the patch layer is a uniform layer of loop slot unit cells in accordance with some embodiments.

FIG. 27 (b) is a plot of reflection phase versus frequency for an exemplary electromagnetic blocking structure according to FIG. 7 in which the conductor layer is a uniform layer of serpentine unit cells in accordance with some embodiments.

FIG. 28 (b) is a plot of reflection phase versus frequency for an exemplary electromagnetic blocking structure according to FIG. 7 in which the conductor layer is a uniform layer of point symmetric double spiral unit cells in accordance with some embodiments.

FIG. 29 (b) is a plot of reflection phase versus frequency for an exemplary electromagnetic blocking structure according to FIG. 7 in which the conductor layer is a uniform layer of line symmetric double spiral unit cells in accordance with some embodiments.

FIG. 30 (b) is a plot of reflection phase versus frequency for an exemplary electromagnetic blocking structure according to FIG. 17 in which the conductor layer is a uniform layer of serpentine unit cells in accordance with some embodiments.

FIG. 31 (b) is a plot of reflection phase versus frequency for an exemplary electromagnetic blocking structure according to FIG. 7 in which the conductor layer is a 3×3 uniform layer of serpentine unit cells in accordance with some embodiments.

FIG. 32 (b) is a plot of reflection phase versus frequency for an exemplary electromagnetic blocking structure according to FIG. 13 in accordance with some embodiments.

FIG. 33 (b) is a plot of reflection phase versus frequency for an exemplary electromagnetic blocking structure according to FIG. 14 in accordance with some embodiments.

FIG. 34 (b) is a plot of reflection phase versus frequency for an exemplary electromagnetic blocking structure according to FIG. 12 (a) in accordance with some embodiments.

FIG. 35 (b) is a plot of reflection phase versus frequency for an exemplary electromagnetic blocking structure according to FIG. 12 (a) in which the first conductor layer is a uniform layer of point symmetric double spiral unit cells, and the second conductor layer is a uniform layer of patch unit cells in accordance with some embodiments.

FIG. 36 (b) is a plot of reflection phase versus frequency for an exemplary electromagnetic blocking structure according to FIG. 12 (a) in which the first conductor layer is a uniform layer of line symmetric double spiral unit cells, and the second conductor layer is a uniform layer of patch unit cells in accordance with some embodiments.

FIG. 37 (b) is a plot of reflection phase versus frequency for an exemplary electromagnetic blocking structure according to FIG. 12 (a) in which the first conductor layer is a uniform layer of serpentine unit cells, and the second conductor layer is a uniform layer of loop unit cells in accordance with some embodiments.

FIG. 38 (b) is a plot of reflection phase versus frequency for an exemplary electromagnetic blocking structure according to FIG. 1 in which the first and second conductor layers are each uniform layers of serpentine unit cells, the first conductor layer having a pattern shown in FIG. 18 (a) and the second conductor layer having a pattern shown in FIG. 18 (b) in accordance with some embodiments.

FIG. 40 (b) is a plot of reflection phase versus frequency for an exemplary electromagnetic blocking structure according to FIG. 8 in which the first and second conductor layers are each uniform layers of point symmetric double spiral unit cells in accordance with some embodiments.

FIG. 41 (b) is a plot of reflection phase versus frequency for an exemplary electromagnetic blocking structure according to FIG. 8 in which the first and second conductor layers are each uniform layers of serpentine unit cells, and the first conductor layer has the unit cell pattern shown in FIG. 19 (b) and the second conductor layer has the unit cell pattern shown in FIG. 19 (a) in accordance with some embodiments.

FIG. 42 (b) is a plot of reflection phase versus frequency for an exemplary electromagnetic blocking structure according to FIG. 15 in accordance with some embodiments.

DETAILED DESCRIPTION

Hereinafter, an electromagnetic blocking structure, dielectric substrate, and unit cell according to some embodiments of the instant application will be described with reference to the drawings. In the following description, the upper and lower surfaces are distinguished from each other as in the case of the upper surface and the like, but this is for convenience and does not limit the upper and lower sides when actually using the substrate or the like.

Embodiments of the present disclosure have been developed to enable the miniaturization of electromagnetic (EM) blocking structures, while at the same time reducing or eliminating anisotropic effects.

Figure 1:
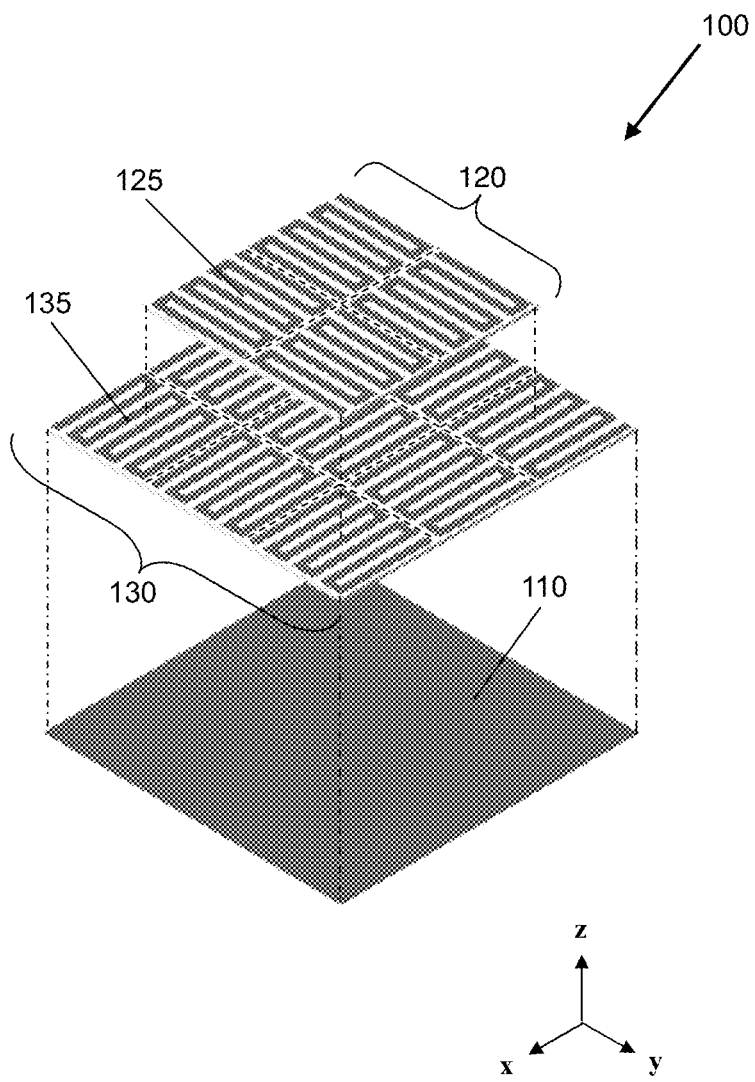
FIG. 1 is a perspective view of an exemplary electromagnetic blocking structure in accordance with some embodiments.

FIG. 1 is a perspective view of an EM blocking structure 100 in accordance with some embodiments. EM blocking structure 100 includes a ground layer 110. A first conductor layer 120 is over a top surface of ground layer 110. A second conductor layer 130 is between first conductor layer 120 and ground layer 110. First conductor layer 120 includes a plurality of unit cells 125, which do not have four-fold symmetry. Unit cells 125 are arranged in a two-dimensional array a same distance from ground layer 110 as every other unit cell 125. Each unit cell 125 has a same shape and a same orientation as every other unit cell 125. Second conductor layer 130 includes a plurality of unit cells 135, which do not have four-fold symmetry. Unit cells 135 are arranged in a two-dimensional array a same distance from ground layer 110 as every other unit cell 135. Each unit cell 135 has a same shape and a same orientation as every other unit cell 135. The orientation of unit cells 135 is rotated 90° with respect to the orientation of unit cells 125 about an axis perpendicular to the top surface of ground layer 110. A dielectric material fills spaces between ground layer 110, first conductor layer 120 and second conductor layer 130. In some embodiments, the dielectric material is a single layer material having a substantially uniform composition. In some embodiments, the dielectric material is a multi-layer material including at least two different compositions. The rotational symmetry of the unit cell is not limited to four-fold symmetry. The rotational symmetry of the unit cell can be changed according to the lattice shape in which the unit cells are arranged. When the unit cell is a rectangular lattice, it does not have bilateral symmetry. When the unit cell is a hexagonal lattice, it does not have six-fold symmetry.

Ground layer 110 is a conductive material and provides shielding for first conductor layer 120 and second conductor layer 130. Ground layer 110 is a continuous plate having an outer perimeter extending to at least an outer edge of second conductor layer 130. Ground layer 110 is electrically connected to a ground voltage. In some embodiments, ground layer 110 includes copper, aluminum, tungsten or another suitable conductive material. A thickness of ground layer 110 ranges from about 1 μm to about 1,000 μm. If a thickness of ground layer 110 is too small, ground layer 110 fails to provide sufficient shielding for first conductor layer 120 and second conductor layer 130, in some instances. If a thickness of ground layer 110 is too great, a size of EM blocking structure 100 increases; material is wasted and production costs increase without a significant increase in functionality, in some instances.

First conductor layer 120 is configured to block a predefined band of EM waves. First conductor layer 120 includes unit cells 125 arrayed in a single layer. Each unit cell 125 is separated from adjacent unit cells 125 by a first distance. A shape, material, and spacing of unit cells 125 determine a wavelength of the EM waves are reflected by first conductor layer 120. In some embodiments, unit cells 125 are in a square array, a rectangular array or another suitable array distribution. In some embodiments, at least one array location in first conductor layer 120 is free of unit cells 125. In some embodiments, the at least one array location in first conductor layer 120 includes a patch cell or a void. In some embodiments, an area of first conductor layer 120 is less than an area of ground layer 110. In some embodiments, the area of first conductor layer 120 is equal to the area of ground layer 110. In some embodiments, an outer edge of first conductor layer 120 is recessed in a direction parallel to the top surface of ground layer 110 from the outer perimeter of ground layer 110 by a distance up to half of a width of a unit cell 125.

A thickness of first conductor layer 120 ranges from about 1 μm to about 1,000 μm. If a thickness of first conductor layer 120 is too small, first conductor layer 120 fails to provide sufficient EM blocking properties, in some instances. If a thickness of conductor layer 120 is too great, a size of EM blocking structure 100 increases; material is wasted and production costs increase without a significant increase in functionality, in some instances.

Each unit cell 125 has a conductive trace, herein called a shape, extending across the unit cell 125. In some embodiments, each unit cell 125 has a shape selected from a serpentine shape, a line symmetric double spiral shape, a point symmetric double spiral shape, an accordion shape, or another suitable shape. In some embodiments, a material of the shape for unit cells 125 includes copper, aluminum, tungsten or another suitable conductive material. In some embodiments, the material of the shape for unit cells 125 is a same material as ground layer 110. In some embodiments, the material of the shape for unit cells 125 is different from the material of ground layer 110.

Second conductor layer 130 is configured to block a predefined band of EM waves. The second conductor layer includes unit cells 135 arrayed in a single layer. Each unit cell 135 is separated from adjacent unit cells 135 by a second distance. In some embodiments, the first distance is equal to the second distance. A shape, material, and spacing of unit cells 135 help to determine a wavelength of the EM waves are reflected by second conductor layer 130. In some embodiments, unit cells 135 are in a square array, a rectangular array or another suitable array distribution. In some embodiments, an area of second conductor layer 130 is less than an area of ground layer 110. In some embodiments, the area of second conductor layer 130 is equal to the area of ground layer 110. In some embodiments, an outer edge of second conductor layer 130 is recessed (or protruded) in a direction parallel to the top surface of ground layer 110 from the outer perimeter of ground layer 110 by a distance up to half of a width of a unit cell 135.

A thickness of second conductor layer 130 ranges from about 1 μm to about 1,000 μm. If a thickness of second conductor layer 130 is too small, second conductor layer 130 fails to provide sufficient EM blocking properties, in some instances. If a thickness of conductor layer 130 is too great, a size of EM blocking structure 100 increases; material is wasted and production costs increase without a significant increase in functionality, in some instances.

Each unit cell 135 has a conductive trace, herein called a shape, extending across the unit cell 135. In some embodiments, each unit cell 135 has a shape selected from a serpentine shape, a line symmetric double spiral shape, a point symmetric double spiral shape, an accordion shape, or another suitable shape. In some embodiments, each unit cell 135 has a same shape as each unit cells 125. In some embodiments, at least one unit cell 135 has a different shape from at least one unit cell 125. In some embodiments, a material of the shape for unit cells 135 includes copper, aluminum, tungsten or another suitable conductive material. In some embodiments, the material of the shape for unit cells 135 is a same material as both ground layer 110 and first conductor layer 120. In some embodiments, the material of the shape for unit cells 135 is different from the material of at least one of ground layer 110 or first conductor layer 120.

Figure 2:
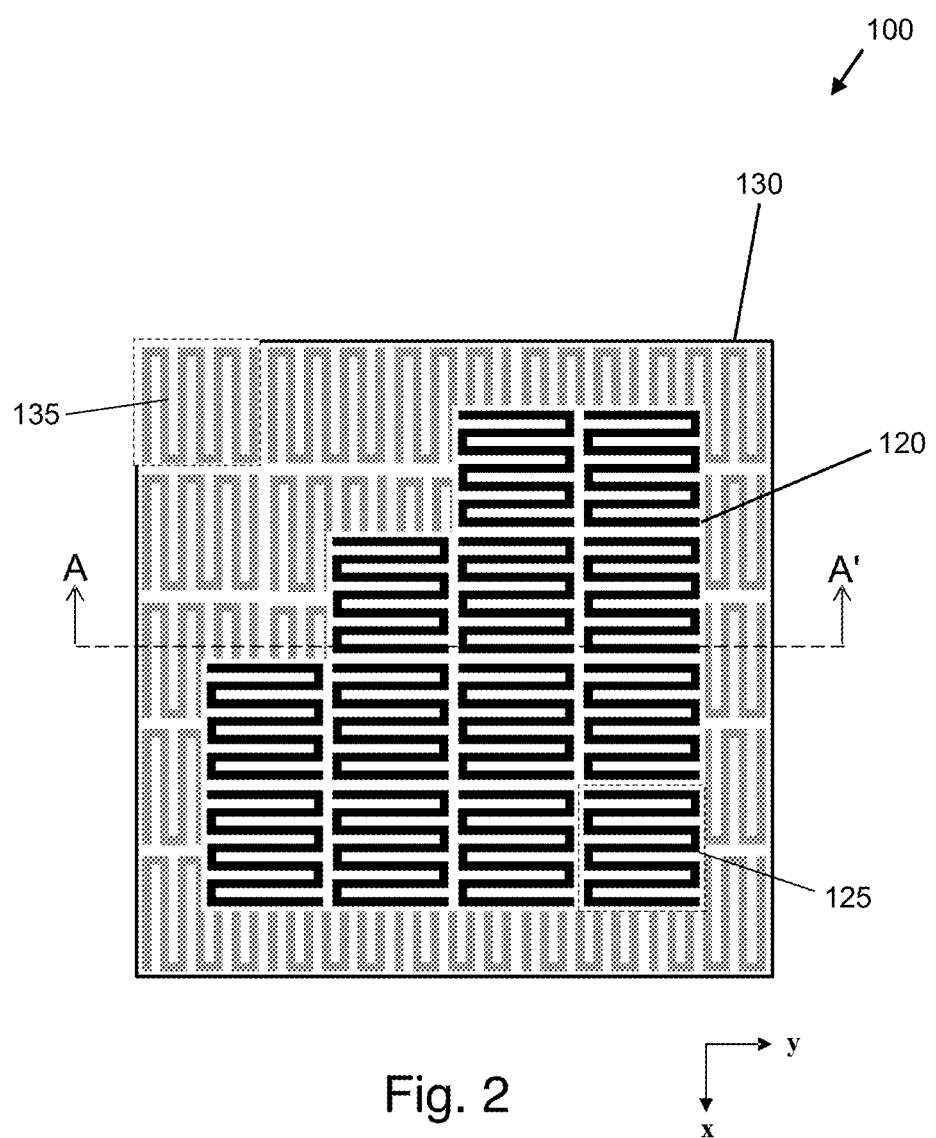
FIG. 2 is a plan view of an exemplary unit cell having a serpentine structure, in accordance with some embodiments.

FIG. 2 is a plan view of the electromagnetic blocking structure 100. Ground layer 110 is not visible in FIG. 2. A portion of first conductor layer 120 is cut away in order to more clearly show the offset of the unit cells 125 relative to the unit cells 135. Unit cells 125 do not completely overlap with corresponding unit cells 135. Rather, unit cells 125 are offset with respect to unit cells 135. In some embodiments, a distance unit cells 125 is offset with respect to unit cells 135 ranges from zero, indicating complete overlap between unit cells 125 and unit cells 135, up to one half of the width of a unit cell 125. Offset amounts outside a certain range exhibit reduced EM blocking characteristics.

Figure 3:
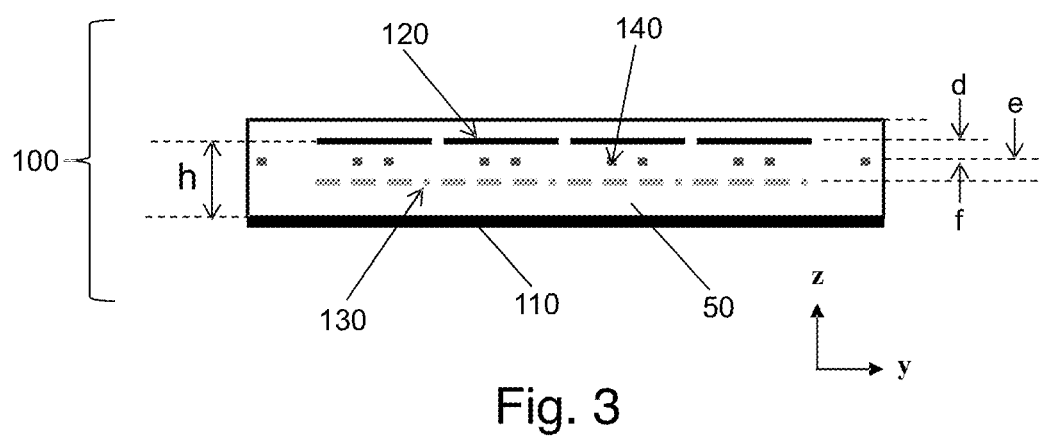
FIG. 3 is a cross-sectional view taken along the section line A-A' of the exemplary electromagnetic blocking structure of FIG. 2 in accordance with some embodiments.

FIG. 3 is a cross section of EM blocking structure 100 according to some embodiments, taken at the location of line A-A' shown in FIG. 2. EM blocking structure 100 optionally includes a third conductor layer 140, between first conductor layer 120 and second conductor layer 130. Dielectric material 50 fills spaces between ground layer 110, first conductor layer 120, second conductor layer 130, and third conductive layer 140. A distance "h" extends between ground layer 110 and first conductor layer 120. A distance "d" extends between a top surface of the electromagnetic blocking structure 100 and first conductor layer 120. A distance "e" extends between the first conductor layer 120 and the third conductor layer 140. A distance "f" extends between the second conductor layer 130 and the third conductor layer 140. In some embodiments, distance d is equal to both distance e and distance f. In some embodiments, distance d is different from at least one of distance e or distance f. A specific measurement example is h=1.68 mm, d=0.3 mm, and e=f=0.08 mm.

Figure 4:
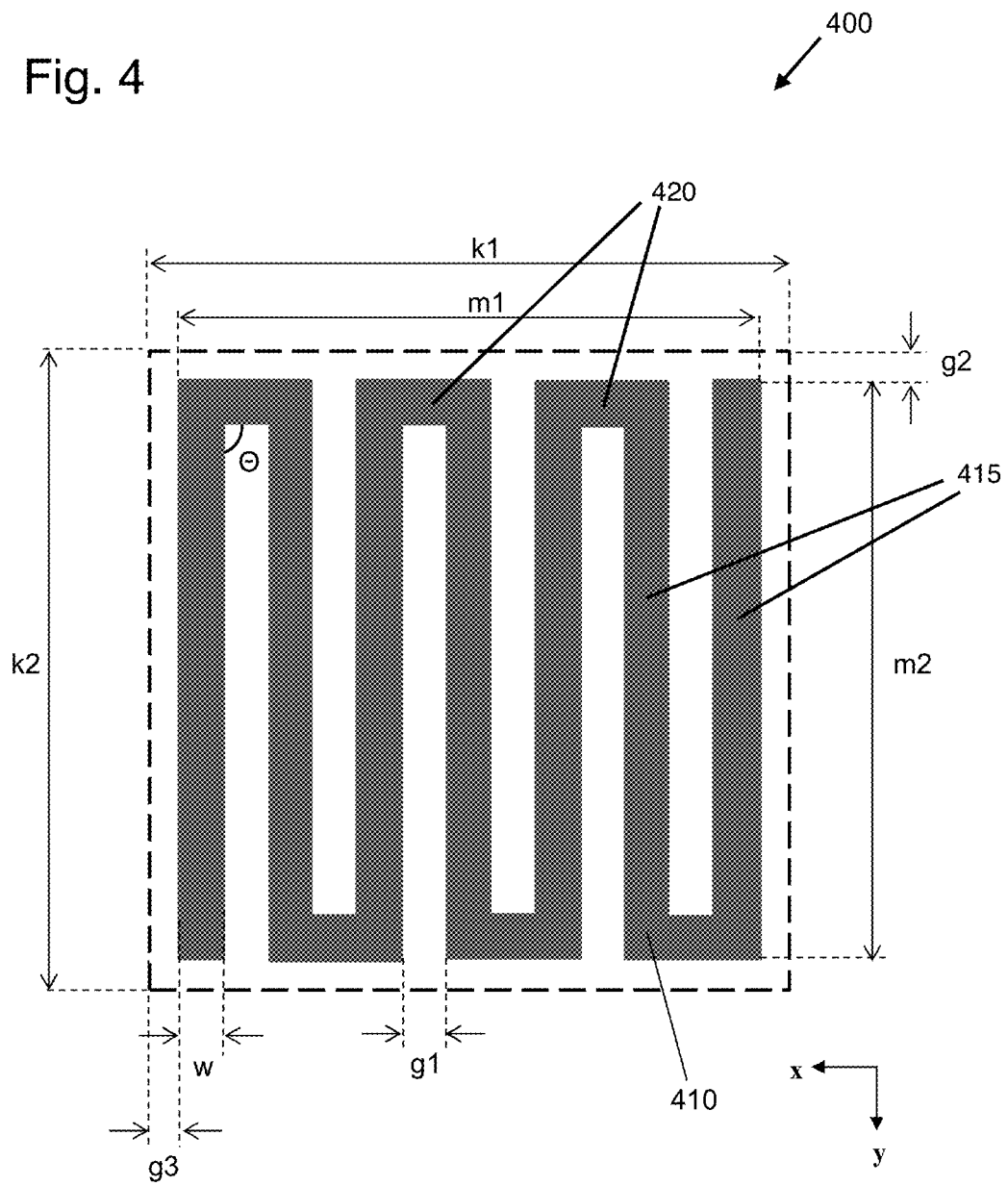
FIG. 4 is a plan view of an exemplary unit cell having a serpentine structure, in accordance with some embodiments.

FIG. 4 is a top view of a unit cell 400 having a serpentine structure 410 according to some embodiments. The serpentine structure 410 includes substantially parallel legs 415 and connecting arms 410 and 420, each leg being connected to an adjacent leg by at least one connecting arm located at an end of the leg. In some embodiments, the legs are parallel to each other. In some embodiments, at least one leg is angled with respect to another leg. In some embodiments, the connecting arms are parallel to each other. In some embodiments, at least one connecting arm is angled with respect to another connecting arm. In some embodiments, an internal angle "Θ" between a leg and a connecting arm is substantially 90°. In some embodiments, the internal angle is greater than 90°. In some embodiments, the internal angle is less than 90°. In some embodiments, the unit cell 400 is square, rectangular, hexagonal or another suitable shape. A distance "m1" is a length of a first side of serpentine structure 410, measured between the outermost legs of the serpentine structure 410. A distance "m2" is a length of a second side of the serpentine structure 410 measured as a length of an outermost leg of the serpentine structure 410. In some embodiments, m1 and m2 are the same. In some embodiments, m1 and m2 are different. The distance "g1" is a distance between two adjacent legs. A distance "w" is a width of at least one leg of the serpentine structure 410. In some embodiments, g1 and w are the same. In some embodiments, g1 and w are different. The broken line around the outside of the serpentine structure 410 defines the perimeter of the unit cell. A distance "k1" is a length of the perimeter on the first side of unit cell 400 and the variable "k2" is a length of the perimeter on a second side of the unit cell 400. In some embodiments k1 and k2 are the same. In some embodiments, k1 and k2 are different. The distance "g2" is a distance between the perimeter of unit cell 400 on the first side and an end of the outermost leg of the serpentine structure 410 on the first side of the unit cell. A distance "g3" extends between the perimeter of unit cell 400 on the second side and the outermost leg of the serpentine structure 410 on the second side. In some embodiments, g2 and g3 are the same. In some embodiments, g2 and g3 are different. A specific measurement example is k1=k2=2.8 mm, m1=m2=2.6 mm, w=0.2 mm, g1=0.2 mm, and g2=g3=0.1 mm.

Figure 5:
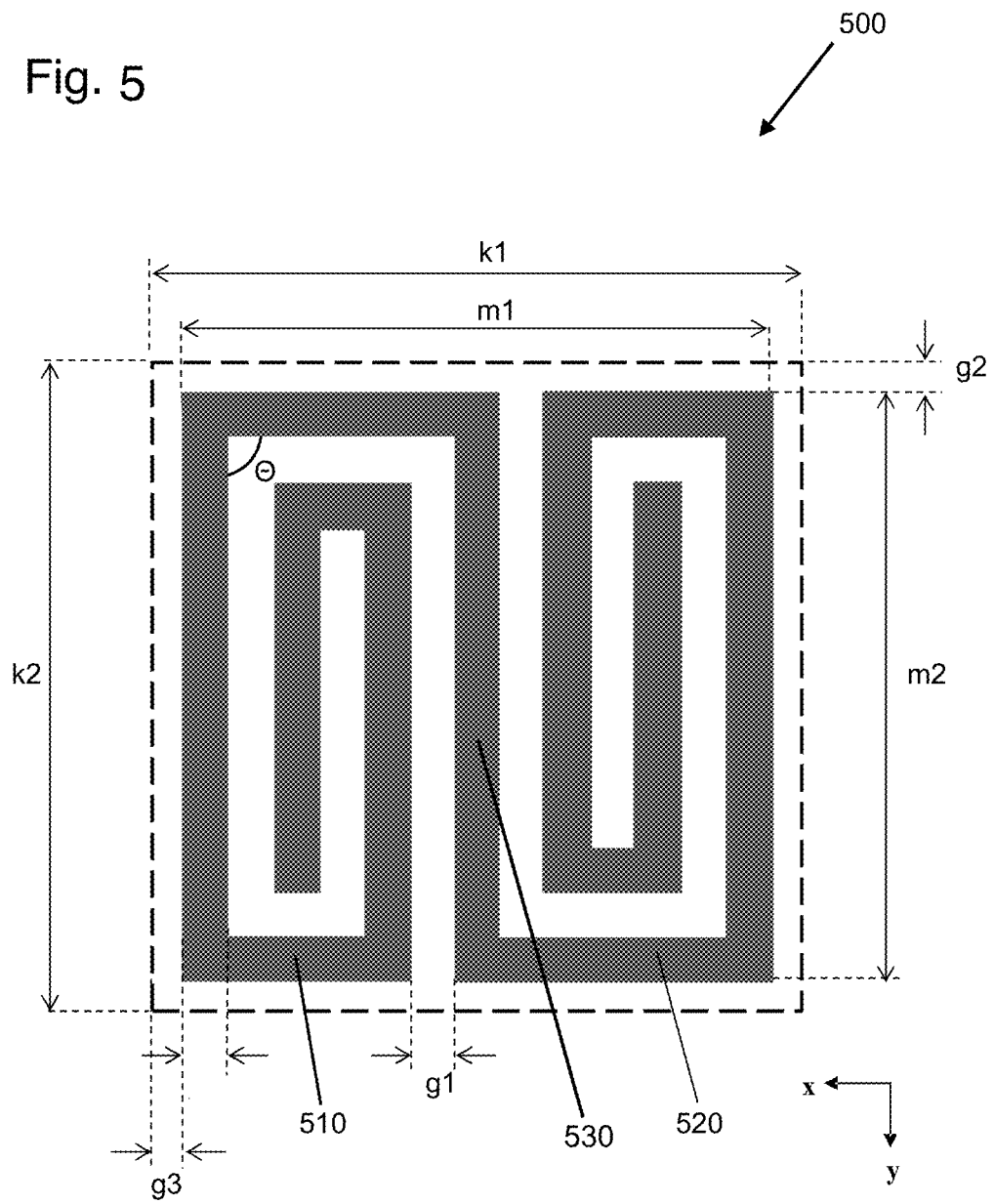
FIG. 5 is a plan view of an exemplary unit cell having a point symmetric double spiral structure, in accordance with some embodiments.

FIG. 5 is a top view of a unit cell 500 having a point symmetric double spiral structure according to some embodiments. The point symmetric double spiral structure includes a first spiral 510 and a second spiral 520 connected to the first spiral by a connecting arm 530. The first spiral 510 and the second spiral 520 are wound in the same direction. The first spiral 510 and the second spiral 520 are connected to the connecting arm 530 from different directions. In some embodiments, each spiral has at least one turn. In some embodiments, each spiral has more or less than 4 turns. In some embodiments, the number of turns of each spiral is the same. In some embodiments, the number of turns in each spiral is different. An internal angle "0" of at least one turn is substantially 90° in some embodiments, and greater than 90° in other embodiments. The internal angle of at least one turn, in some embodiments, is less than 90°. In some embodiments, the unit cell 500 is square, rectangular, hexagonal or another suitable shape. The dimensions k1, k2, m1, m2, g1, g2, g3 represent substantially the same measurement attributes of unit cell 500 as in unit cell 400. A specific measurement example is k1=k2=2.8 mm, m1=m2=2.6 mm, w=0.2 mm, g1=0.2 mm, and g2=g3=0.1 mm.

Figure 6:
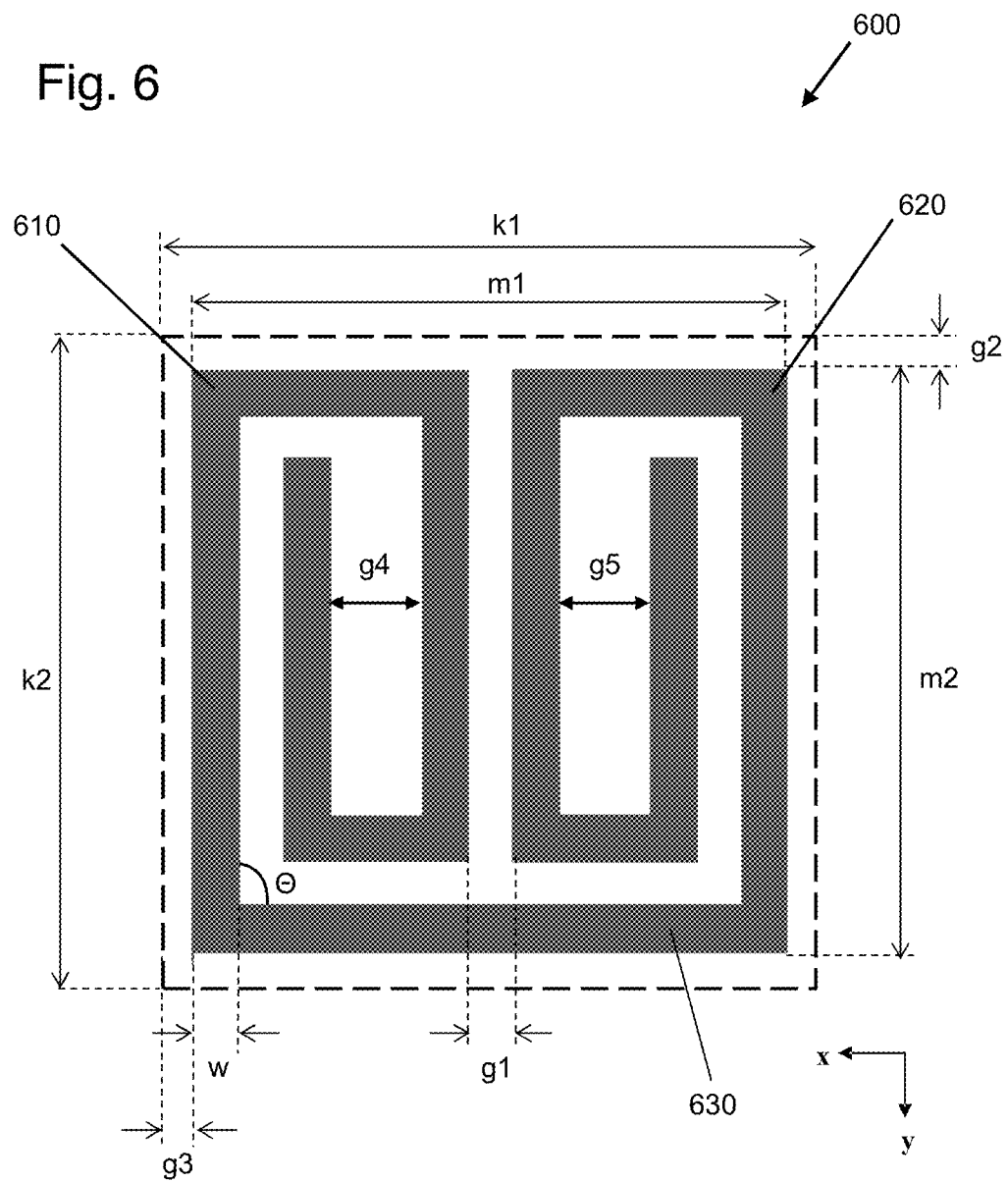
FIG. 6 is a plan view of an exemplary unit cell having a line symmetric double spiral structure, in accordance with some embodiments.

FIG. 6 is a top view of a unit cell 600 having a line symmetric double spiral structure according to some embodiments. The line symmetric double spiral structure includes a first spiral 610 and a second spiral 620 connected to the first spiral by a connecting arm 630. The first spiral 610 is wound in a first direction, and the second spiral 620 is wound in a second direction. The second direction is opposite of the first direction. The first spiral 610 and the second spiral 620 are connected to the connecting arm 630 from the same direction. In some embodiments, each spiral has at least one turn. In some embodiments, each spiral has more or less than 4 turns. In some embodiments, the number of turns of each spiral is the same. In some embodiments, the number of turns in each spiral is different. An internal angle "0" of at least one turn is substantially 90° in some embodiments, and greater than 90° in other embodiments. The internal angle of at least one turn in some embodiments is less than 90°. In some embodiments, the unit cell 600 is square, rectangular or another suitable shape. The dimensions k1, k2, m1, m2, g1, g2, g3 represent substantially the same measurement attributes of unit cell 600 as in unit cell 400. A distance g4 extends between two legs of first spiral 610 and a distance g5 extends between two legs of the second spiral 620. In some embodiments, g4 and g5 are the same, and in other embodiments, g4 and g5 are different. A specific measurement example is k1=k2=2.8 mm, m1=m2=2.6 mm, w=0.2 mm, g1=0.2 mm, g2=g3=0.1 mm, and g4=g5=0.4 mm.

Figure 7:
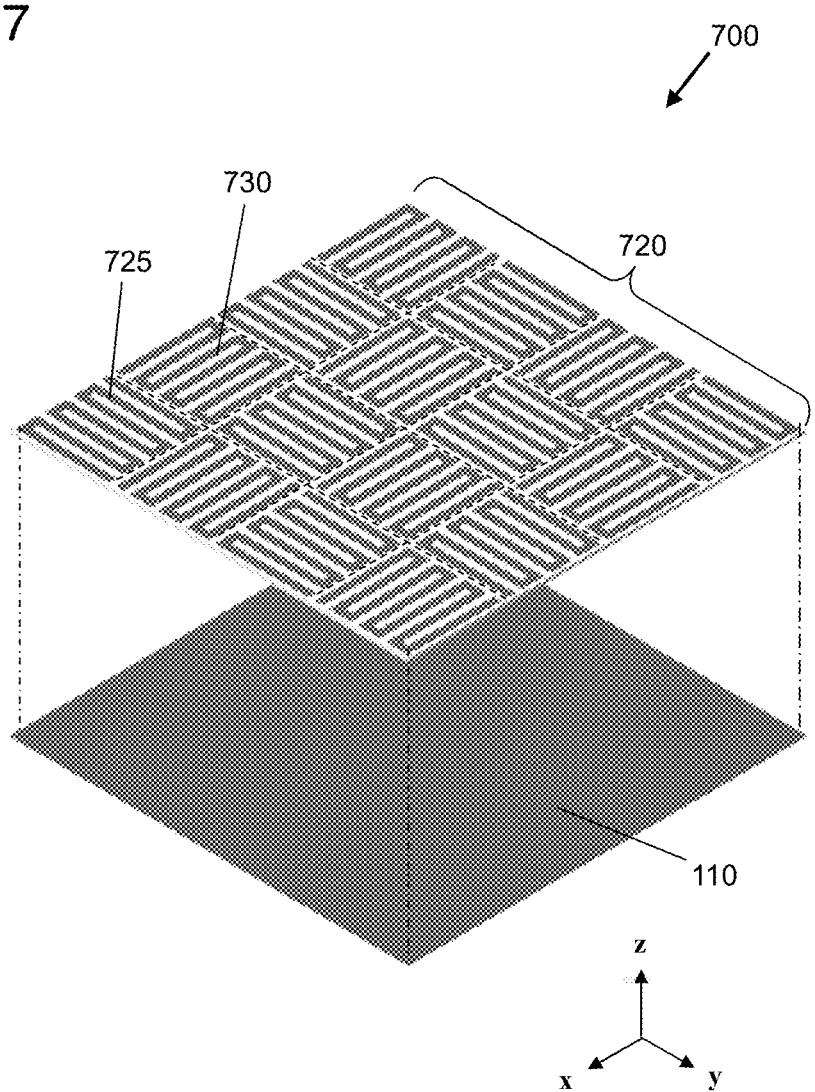
FIG. 7 is a perspective view of an exemplary electromagnetic blocking structure in accordance with some embodiments.

FIG. 7 is a perspective view of an EM blocking structure 700 in accordance with some embodiments. Electromagnetic blocking structure 700 includes a ground layer 110. A conductor layer 720 is over a top surface of ground layer 110. Conductor layer 720 includes a plurality of unit cells 725 and a plurality of unit cells 730 in an alternating arrangement. Unit cells 725 and 730 are arranged in a two-dimensional array a same distance from ground layer 110 as every other unit cell 725 and unit cell 730. Each unit cell 725 has a same shape and a same orientation as every other unit cell 725. Each unit cell 730 has a same shape and a same orientation as every other unit cell 730. At least one unit cell 730 is oriented substantially 90° in either a clockwise or counter-clockwise direction relative to an adjacent unit cell 725. A dielectric material fills spaces between ground layer 110 and conductor layer 720. In some embodiments, the dielectric material is a single layer material having a substantially uniform composition. In some embodiments, the dielectric material is a multi-layer material including at least two different compositions.

Conductor layer 720 is configured to block a predefined band of EM waves. Conductor layer 720 includes unit cells 725 and 730 arrayed in a single layer. Each unit cell 725 is separated from adjacent unit cells 730 or adjacent unit cells 725 by a first distance. A shape, material, and spacing of unit cells 725 and unit cells 730 help to determine a wavelength of the EM waves reflected by conductor layer 720. In some embodiments, unit cells 725 and 730 are in a square array, a rectangular array or another suitable array distribution. In some embodiments, at least one array location in conductor layer 720 is free of unit cells 725 and unit cells 730. In some embodiments, the at least one array location in conductor layer 720 includes a patch cell or a void. In some embodiments, an area of first conductor layer 720 is less than an area of ground layer 110. In some embodiments, the area of first conductor layer 720 is equal to the area of ground layer 110. In some embodiments, an outer edge of first conductor layer 720 is recessed in a direction parallel to the top surface of ground layer 110 from the outer perimeter of ground layer 110 by a distance up to half of a width of a unit cell 725 or unit cell 730.

A thickness of first conductor layer 720 ranges from about 1 μm to about 1,000 μm. If a thickness of first conductor layer 720 is too small, first conductor layer 720 fails to provide sufficient electromagnetic blocking properties, in some instances. If a thickness of conductor layer 720 is too great, a size of EM blocking structure 700 increases; material is wasted and production costs increase without a significant increase in functionality, in some instances.

Each unit cell 725 has a conductive trace, herein called a shape, extending across the unit cell 725. In some embodiments, each unit cell 725 has a shape selected from a serpentine shape, a line symmetric double spiral shape, a point symmetric double spiral shape, an accordion shape, or another suitable shape. In some embodiments, a material of the shape for unit cells 725 includes copper, aluminum, tungsten or another suitable conductive material. In some embodiments, the material of the shape for unit cells 725 is a same material as ground layer 110. In some embodiments, the material of the shape for unit cells 725 is different from the material of ground layer 110.

Each unit cell 730 has a conductive trace, herein called a shape, extending across the unit cell 730. In some embodiments, each unit cell 730 has a shape selected from a serpentine shape, a line symmetric double spiral shape, a point symmetric double spiral shape, an accordion shape, or another suitable shape. In some embodiments, a material of the shape for unit cells 730 includes copper, aluminum, tungsten or another suitable conductive material. In some embodiments, the material of the shape for unit cells 730 is a same material as ground layer 110. In some embodiments, the material of the shape for unit cells 730 is different from the material of ground layer 110.

Figure 8:
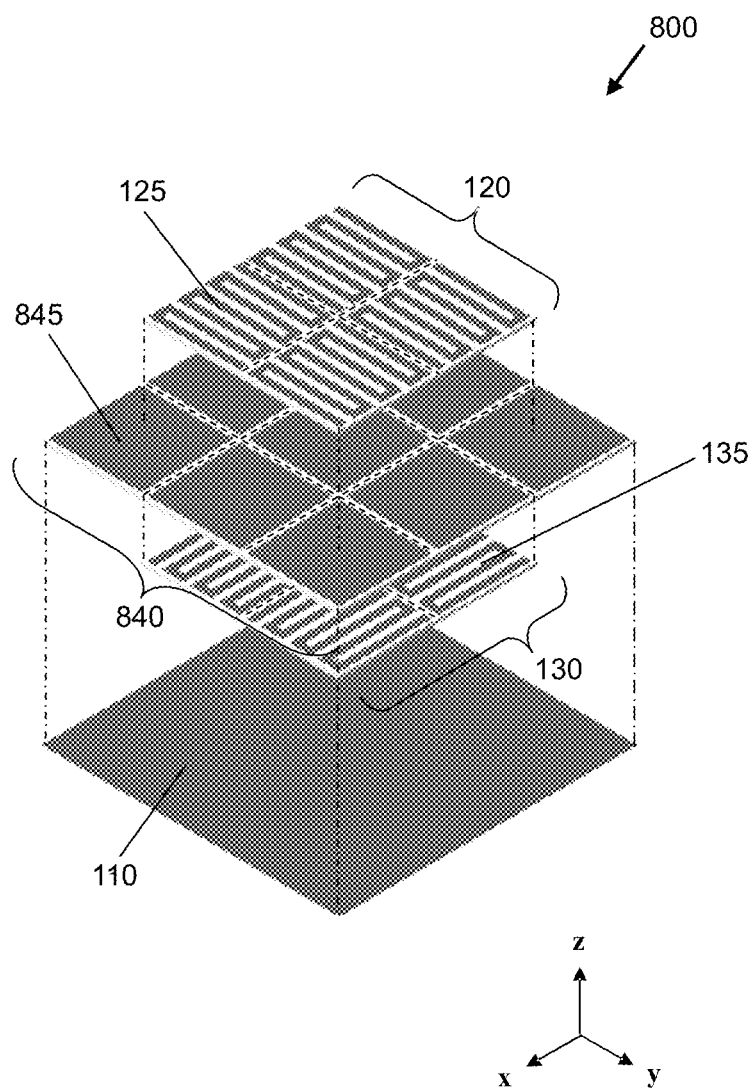
FIG. 8 is a perspective view of an exemplary electromagnetic blocking structure in accordance with some embodiments.

FIG. 8 is a perspective view of an EM blocking structure 800 in accordance with some embodiments. In comparison with EM blocking structure 100, EM blocking structure 800 includes a patch layer 840 between first conductor layer 120 and second conductor layer 130.

Patch layer 840 is configured to block a predefined band of electromagnetic (EM) waves. Patch layer 840 includes unit cells 845 arrayed in a single layer. Each unit cell 845 is separated from adjacent unit cells 845 by a first distance. A shape, material, and spacing of unit cells 845 help to determine a wavelength of the EM waves reflected by patch layer 840. In some embodiments, unit cells 845 are in a square array, a rectangular array or another suitable array distribution. In some embodiments, at least one array location in patch layer 840 is free of unit cells 845. In some embodiments, the at least one array location in patch layer 840 includes a patch cell or a void. In some embodiments, an area of patch layer 840 is less than an area of ground layer 110. In some embodiments, the area of patch layer 840 is equal to the area of ground layer 110. In some embodiments, an outer edge of patch layer 840 is recessed in a direction parallel to the top surface of ground layer 110 from the outer perimeter of ground layer 110 by a distance up to half of a width of a unit cell 845.

A thickness of patch layer 840 ranges from about 1 μm to about 1,000 μm. If a thickness of patch layer 840 is too small, patch layer 840 fails to provide sufficient electromagnetic blocking properties, in some instances. If a thickness of patch layer 840 is too great, a size of EM blocking structure 800 increases; material is wasted and production costs increase without a significant increase in functionality, in some instances.

Each unit cell 845 has a conductive trace, herein called a shape, extending across the unit cell 845. In some embodiments, each unit cell 845 has a shape selected from a patch shape, a loop shape, a loop slot shape, or another suitable shape. In some embodiments, a material of the shape for unit cells 845 includes copper, aluminum, tungsten or another suitable conductive material. In some embodiments, the material of the shape for unit cells 845 is a same material as ground layer 110, first conductor layer 120, and second conductor layer 130. In some embodiments, the material of the shape for unit cells 845 is different from the material of at least one of ground layer 110, first conductor layer 120, and second conductor layer 130.

Figure 9:
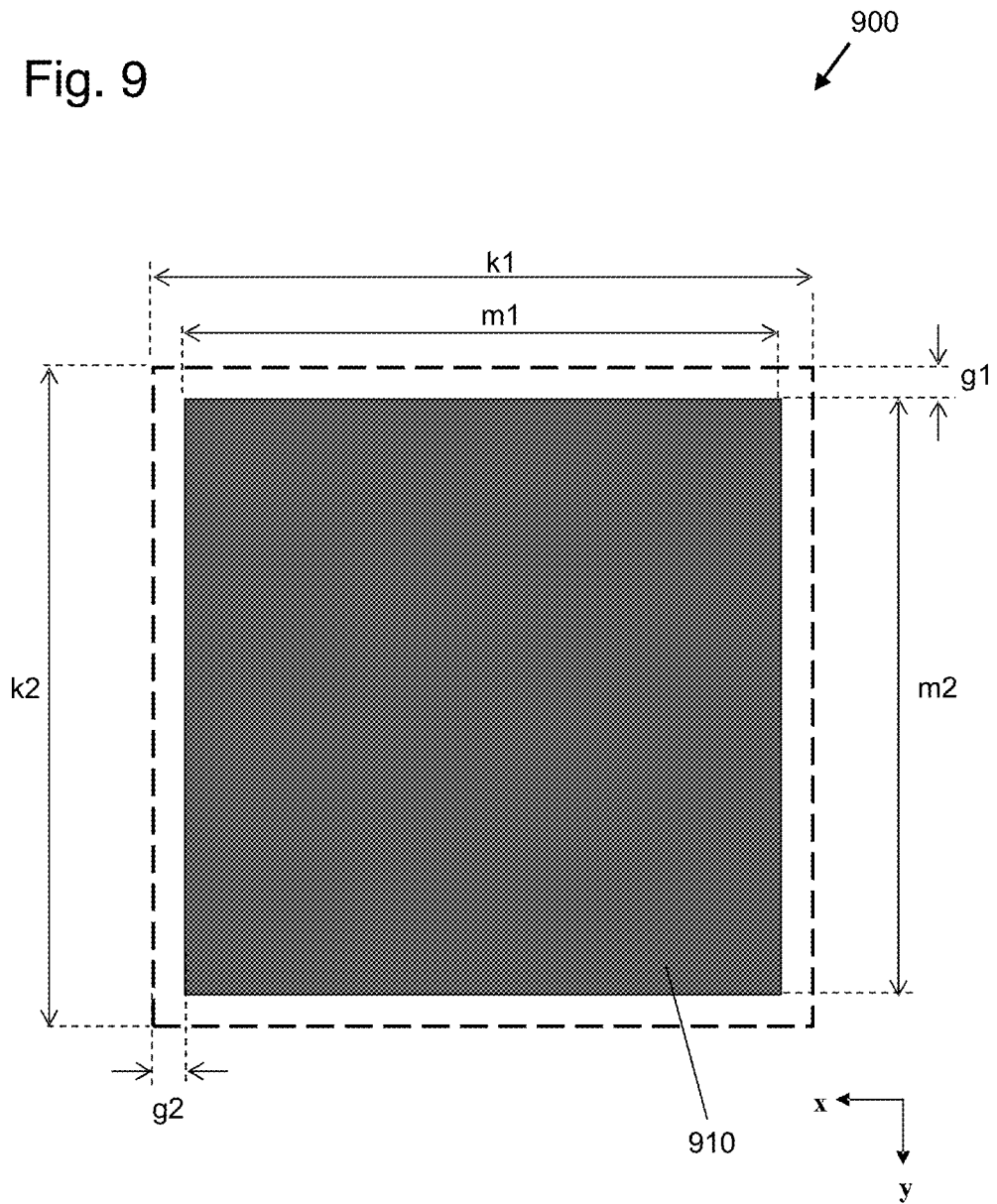
FIG. 9 is a plan view of an exemplary unit cell having a patch structure, in accordance with some embodiments.

FIG. 9 is a unit cell 900 having a patch structure 910 according to some embodiments. The patch structure includes substantially square patch of conductive material in some embodiments.

In some embodiments, the unit cell 900 is square, rectangular, hexagonal or another suitable shape. A distance "m1" is a length of a first side of the patch structure 910. The dimensions k1, k2, m1, m2, g1, and g2 represent substantially the same measurement attributes of unit cell 900 as in unit cell 400. A specific measurement example is k1=k2=2.8 mm, m1=m2=2.6 mm, and g1=g2=0.1 mm.

Figure 10:
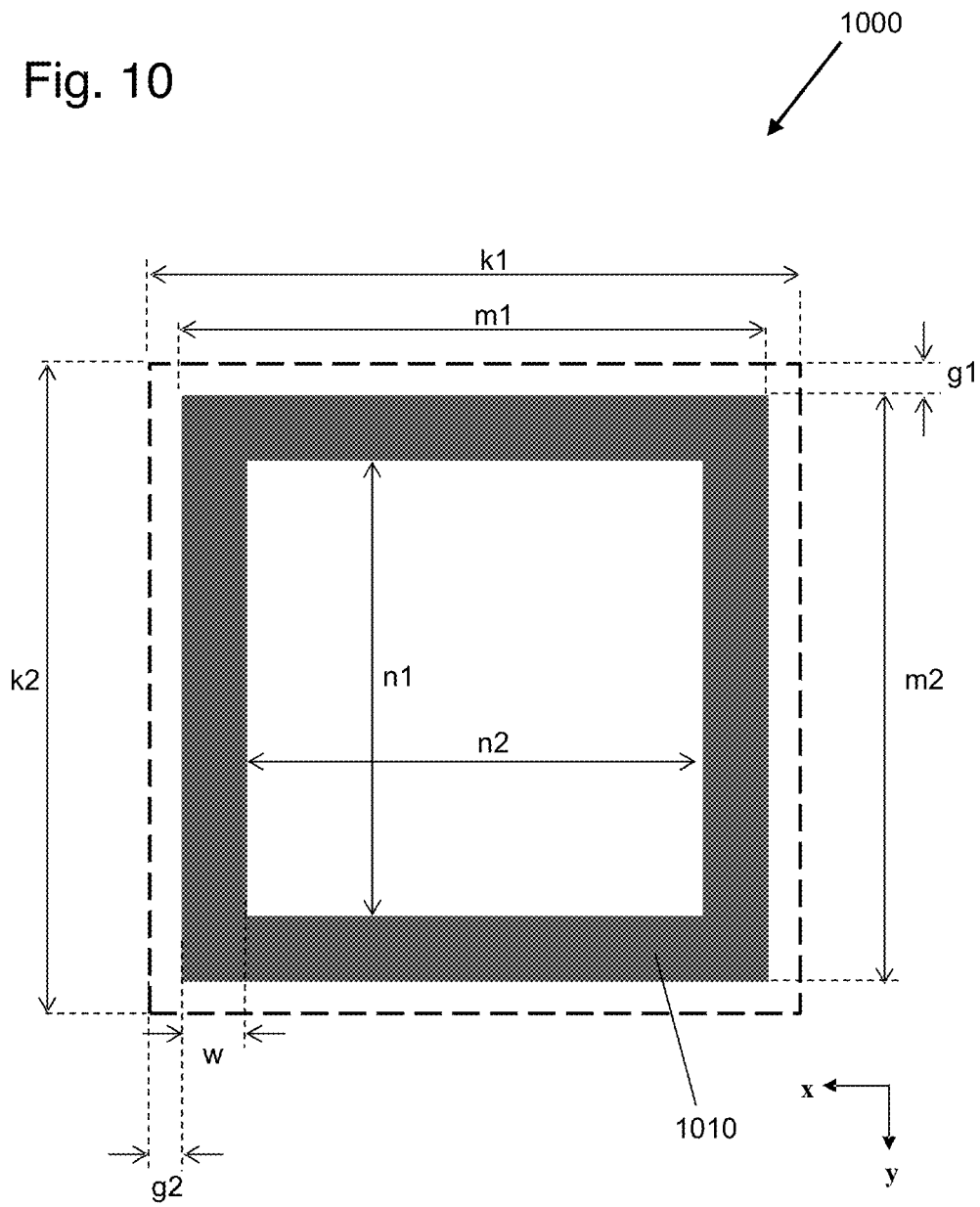
FIG. 10 is a plan view of an exemplary unit cell having a loop structure, in accordance with some embodiments.

FIG. 10 is a unit cell 1000 having a loop structure 1010 according to some embodiments. The loop structure includes a trace of conductive material following a perimeter of unit cell 1000. The dimensions k1, k2, m1, m2, g1, and g2 represent substantially the same measurement attributes of unit cell 1000 as in unit cell 400. A specific measurement example is k1=k2=2.8 mm, m1=m2=2.6 mm, w=0.2 mm, and g1=g2=0.1 mm.

In some embodiments, the unit cell 1000 is square, rectangular, hexagonal or another suitable shape. A distance "n1" extends across a void area from an inner edge of the loop on a first side of the loop structure 1010 to an inner edge of the loop on a second side of the loop structure 1010. A distance "n2" extends in a direction perpendicular to the n1 distance across a void area from an inner edge of the loop on a third side of the loop structure 1010 to an inner edge of the loop on a fourth side of the loop structure 1010. In some embodiments, n and n1 are the same. In some embodiments, n and n1 are different.

Figure 11:
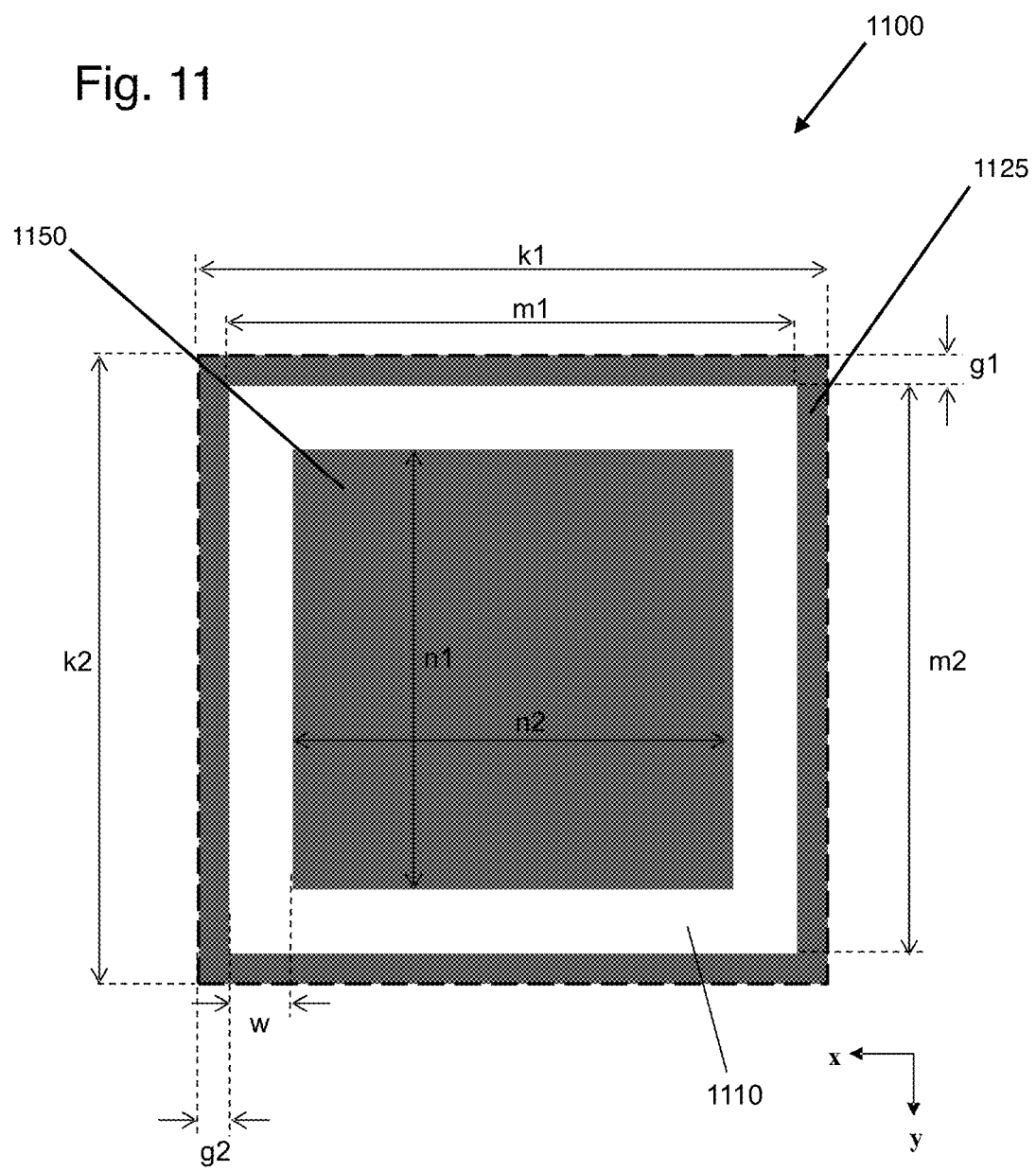
FIG. 11 is a plan view of an exemplary unit cell having a loop slot structure, in accordance with some embodiments.

FIG. 11 is a unit cell 1100 having a loop slot structure 1110 according to some embodiments. In some embodiments, the loop slot structure includes a loop of conductive material 1125 surrounding a patch of conductive material 1150 with a void area between the patch and the loop. In some embodiments, the unit cell 1100 is square, rectangular, or another suitable shape. The dimensions k1, k2, w, m1, m2, g1, and g2 represent substantially the same measurement attributes as in unit cell 400. A specific measurement example is k1=k2=2.8 mm, w=0.2 mm, m1=m2=2.6 mm, and g1=g2=0.1 mm.

FIG. 12 (a) is a perspective view of an EM blocking structure 1200 in accordance with some embodiments. In comparison with EM blocking structure 700, EM blocking structure 1200 includes a patch layer 1230. Patch layer 1230 includes a plurality of unit cells 1235. Patch layer 1230 is similar to patch layer 840. Unit cells 1235 are selectable from unit cells 900, 1000 and 1100. A description of these elements is not repeated here for the sake of brevity. An overlap of the unit cells 725 and 730 of layer 720 is offset such that corners of respective unit cells 725 and 730 overlap a center portion of a respective unit cell 1235 of layer 1230. A broken line representing this overlap is shown in FIG. 12 (b).

FIG. 12 (b) is a plan view of EM blocking structure 1200. The broken line "A" illustrates a region where first conductor layer 720 overlaps with second conductor layer 1230.

Figure 13:
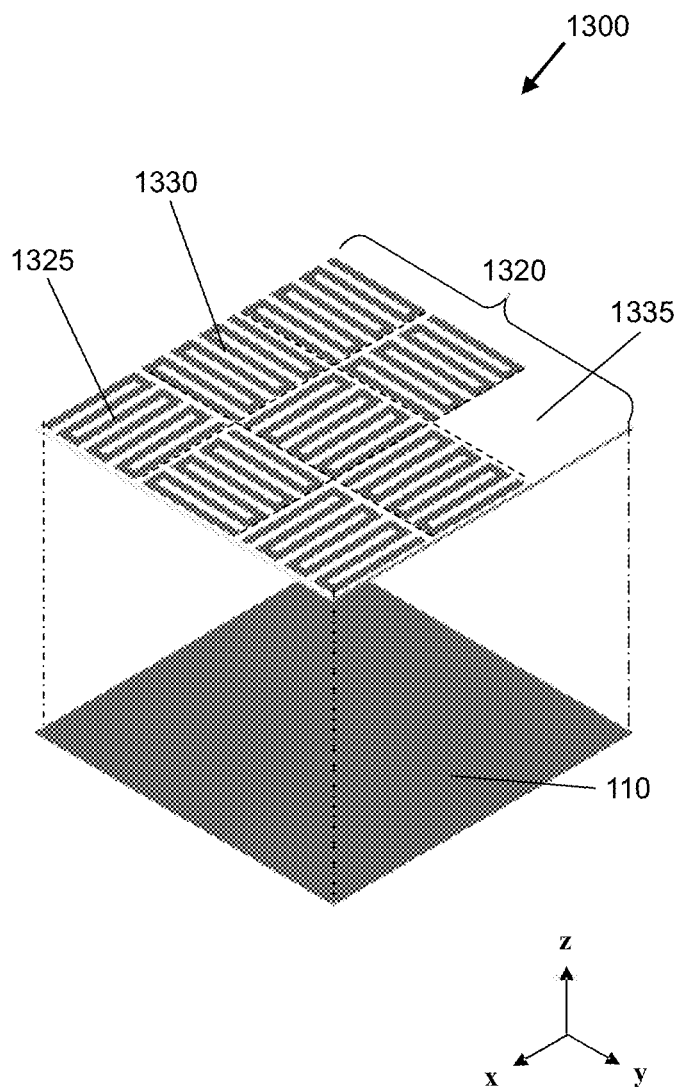
FIG. 13 is a perspective view of an exemplary electromagnetic blocking structure in accordance with some embodiments.

FIG. 13 is a perspective view of EM blocking structure 1300 in accordance with some embodiments. EM blocking structure 1300 is similar to EM blocking structure 700. Unit cell 1325 is similar to unit cell 725 and unit cell 1330 is similar to unit cell 730. A description of the unit cells is not repeated here for the sake of brevity. In comparison with EM blocking structure 700, EM blocking structure 1300 includes a void 1335 in place of a unit cell 1325 or a unit cell 1330. In some embodiments, more than one unit cell 1320 or unit cell 1330 are replaced by a void 1335.

Figure 14:
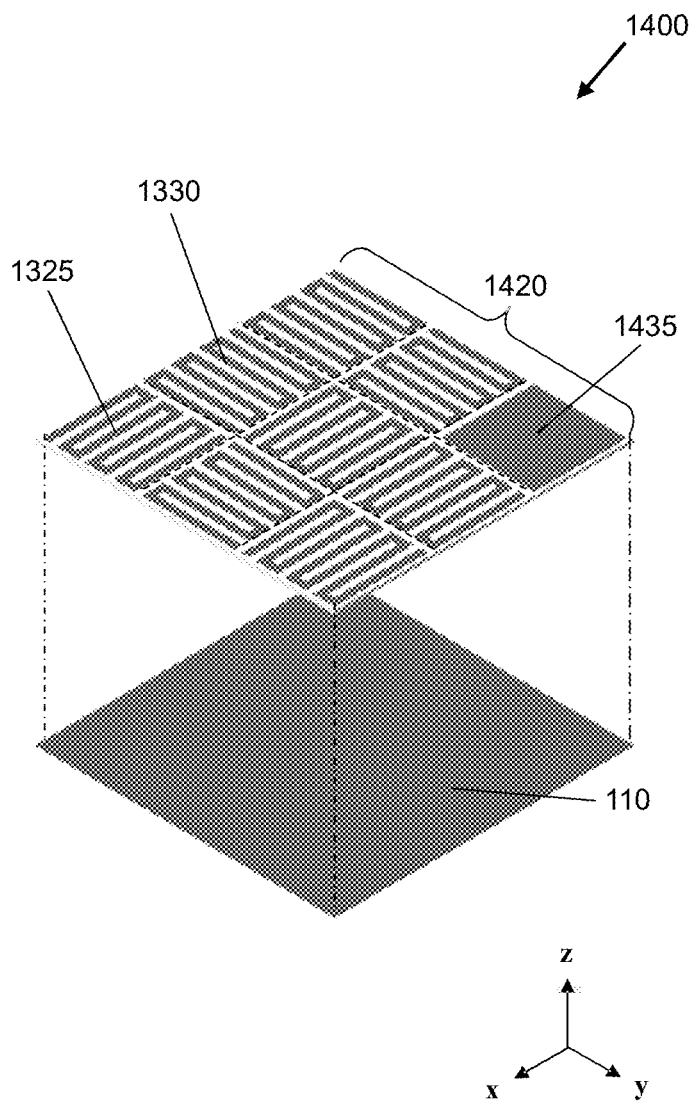
FIG. 14 is a perspective view of an exemplary electromagnetic blocking structure in accordance with some embodiments.

FIG. 14 is a perspective view of EM blocking structure 1400 in accordance with some embodiments. EM blocking structure 1400 is similar to EM blocking structure 700. Unit cell 1325 is similar to unit cell 725 and unit cell 1330 is similar to unit cell 730. A description of the unit cells is not repeated here for the sake of brevity. In comparison with EM blocking structure 700, EM blocking structure 1400 includes a void 1435 in place of a unit cell 1325 or a unit cell 1330. In some embodiments, more than one unit cell 1325 or unit cell 1330 are replaced by a patch 1435.

Figure 15:
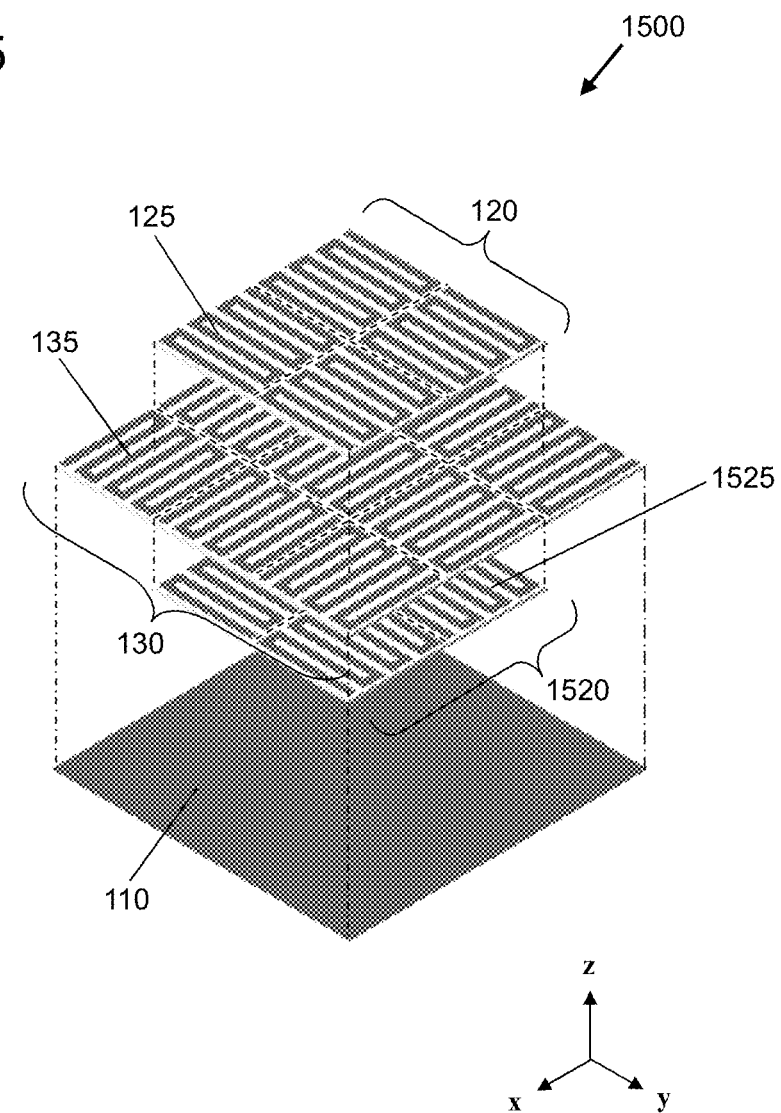
FIG. 15 is a perspective view of an exemplary electromagnetic blocking structure in accordance with some embodiments.

FIG. 15 is a perspective view of the exemplary embodiment of FIG. 1 with an additional third conductor layer 1520 between ground layer 110 and second conductor layer 130.

Figure 16A:
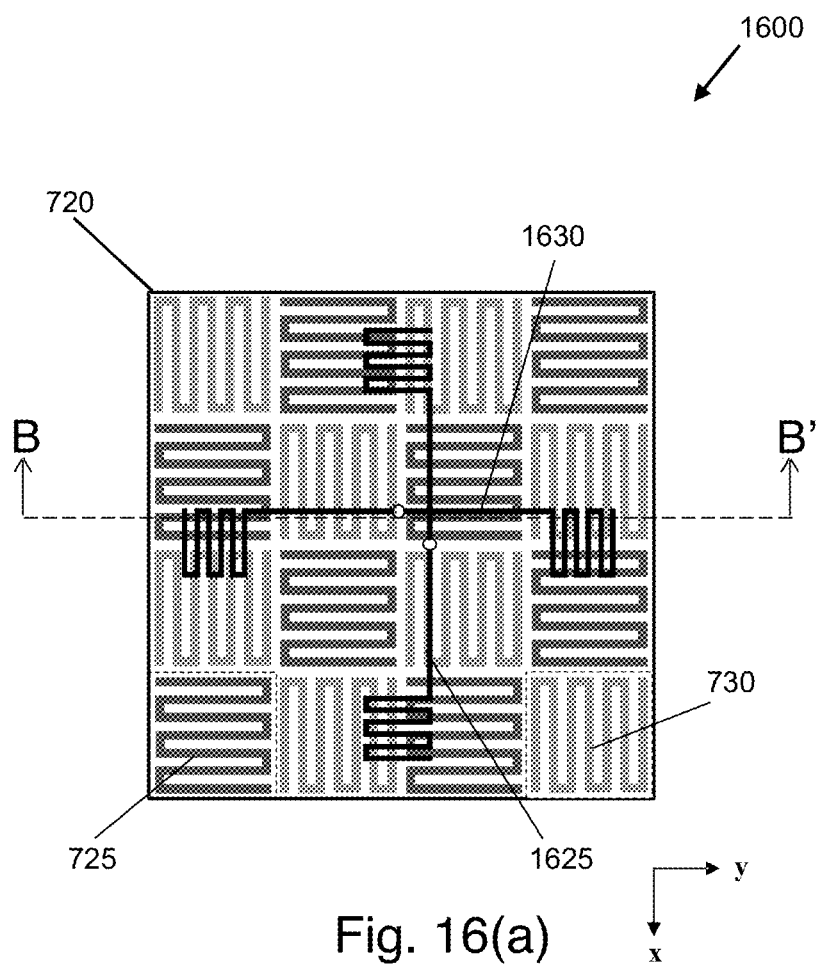
FIG. 16 (a) is a plan view of an exemplary electromagnetic blocking structure including an antenna electromagnetic blocking structure in accordance with some embodiments.
Figure 16B:
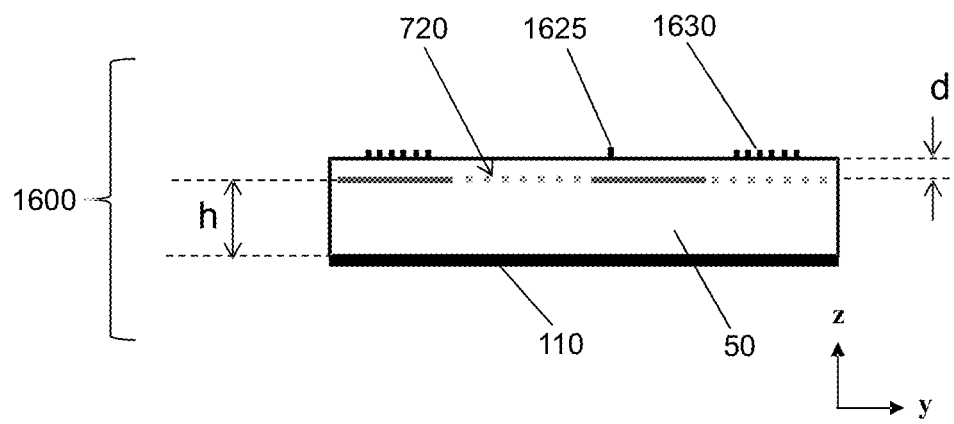

FIG. 16 (a) is a plan view of the exemplary embodiment of FIG. 7 with antenna elements 1625 and 1630 on the surface of substrate 1600. In some embodiments, antenna element 1625 includes a serpentine-shaped portion similar to unit cell 400. In some embodiments, antenna element 1630 includes a serpentine-shaped portion similar to unit cell 400. In some embodiments, antenna elements 1625 and 1630 have the same resonance frequency, and in other embodiments, antenna elements 1625 and 1630 have different resonance frequencies. An example of a resonance frequency for either or both antenna elements 1625 and 1630 is 5.27 GHz. In some embodiments, antenna element 1625 has a resonance frequency higher than 5.27 GHz, and in other embodiments, antenna element 1625 has a resonance frequency less than 5.27 GHz. In some embodiments, substrate 1600 includes one of either antenna element 1625 or 82. In some embodiments, substrate 1600 includes both antenna element 1625 and 82. Some embodiments of substrate 1600 contain more than two antenna elements. In some embodiments, antenna element 1625 and/or antenna element 1630 are linearly polarized and in other embodiments, antenna element 1625 and/or antenna element 1630 are circularly polarized.

FIG. 16 (b) is a cross section of substrate 1600 taken along the line B-B' of FIG. 16 (a). The dimensions h and d represent substantially the same measurement attributes in unit cell 1600 as in unit cell 100. A specific measurement example is h=1.68 mm and d=0.3 mm.

Figure 17:
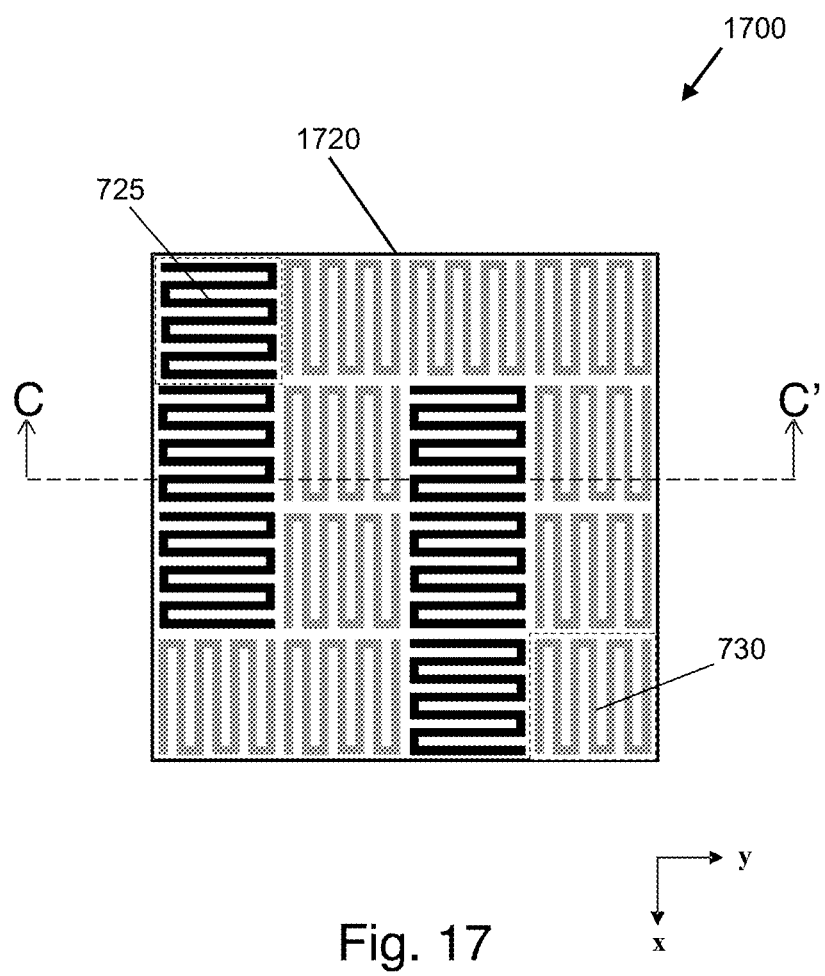
FIG. 17 is a plan view of an exemplary electromagnetic blocking structure in accordance with some embodiments.

FIG. 17 is a plan view of a conductor layer 1720 according to at least one embodiment. Conductor layer 1720 is similar to conductor layer 720. In comparison with conductor layer 720, conductor layer 1720 has a different pattern for unit cells 725 and unit cells 730. Conductor layer 1720 includes four vertical columns. In the first (leftmost) column, three unit cells 725 are sequentially arranged vertically above an adjacent unit cell 730. The second (adjacent to the leftmost column) column includes four unit cells 730. The third column includes one unit cell 730 arranged vertically adjacent to three sequentially arranged unit cells 725. The fourth column includes four unit cells 730 arranged substantially the same as the second column. In some embodiments, conductor layer 1720 includes more or less than four columns. One of ordinary skill in the art would recognize that additional variations in the pattern of unit cells 725 and unit cells 730 are within the scope of this description.

Figures 18A, 18B:
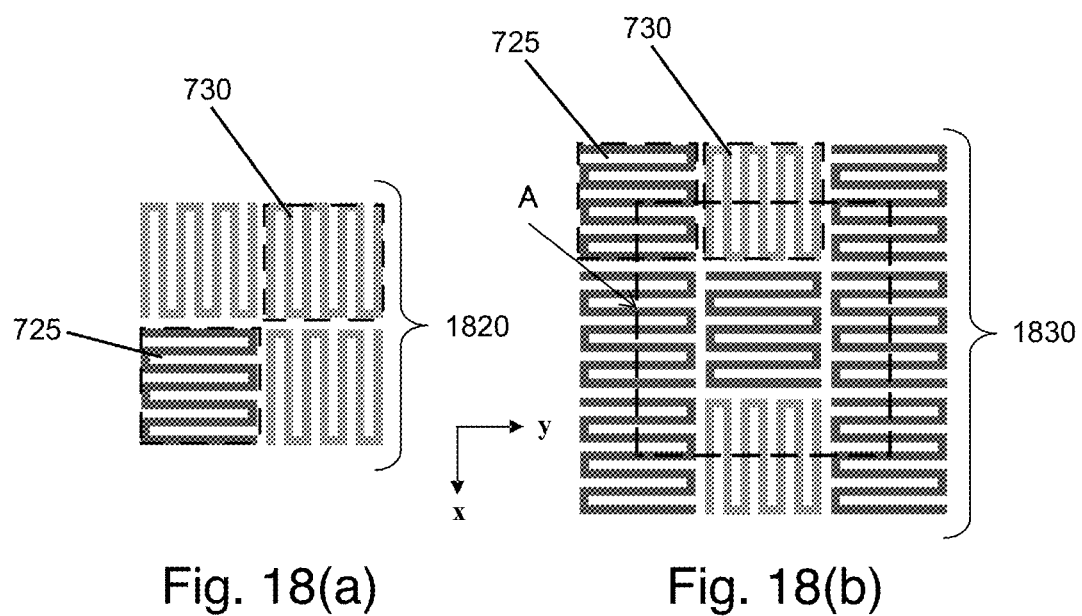
FIG. 18 (a) is a plan view of an exemplary electromagnetic blocking structure in accordance with some embodiments.

FIG. 18 (a) is a plan view of a pattern of unit cells 725 and 730 for a conductor layer 1820 according to at least one embodiment. Conductor layer 1820 is similar to conductor layer 720. In comparison with conductor layer 720, conductor layer 1820 has a different pattern for unit cells 725 and unit cells 730. Conductor layer 1820 includes two vertical columns. In the first (leftmost) column, one unit cell 730 is sequentially arranged vertically above an adjacent unit cell 725. The second (adjacent to the leftmost column) column includes two unit cells 730. In some embodiments, conductor layer 1820 includes more or less than two columns. One of ordinary skill in the art would recognize that additional variations in the pattern of unit cells 725 and unit cells 730 are within the scope of this description.

FIG. 18 (b) is a plan view of a pattern of unit cells 725 and 730 for a conductor layer 1830 according to at least one embodiment. Conductor layer 1830 is similar to conductor layer 720. In comparison with conductor layer 720, conductor layer 1830 has a different pattern for unit cells 725 and unit cells 730. Conductor layer 1830 includes three vertical columns. In the first (leftmost) column, three unit cells 725 are sequentially arranged vertically. The second (adjacent to the leftmost column) one unit cell 725 arranged between two adjacent unit cells 730. The third column includes three unit cells 725 sequentially arranged. In some embodiments, conductor layer 1830 includes more or less than three columns. One of ordinary skill in the art would recognize that additional variations in the pattern of unit cells 725 and unit cells 730 are within the scope of this description.

Figure 19A:
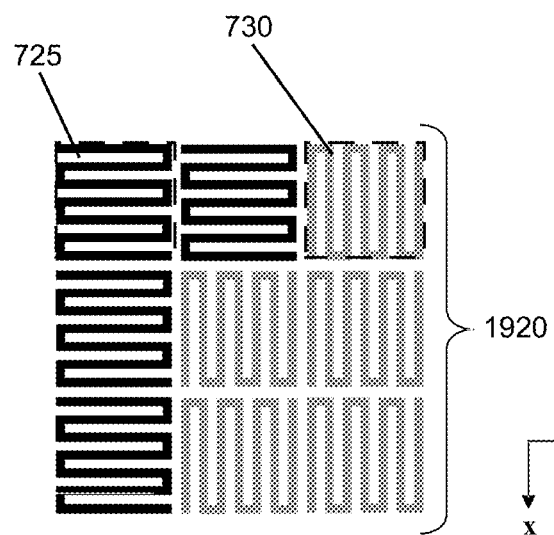
FIG. 19 (a) is a plan view of an exemplary electromagnetic blocking structure in accordance with some embodiments.
Figure 19B:
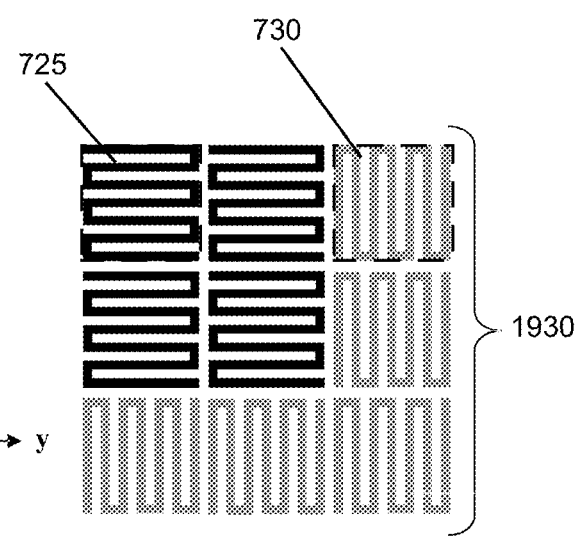

FIG. 19 (a) is a plan view of a conductor layer 1920 according to at least one embodiment. Conductor layer 1920 is similar to conductor layer 720. In comparison with conductor layer 720, conductor layer 1920 has a different pattern for unit cells 725 and unit cells 730. Conductor layer 1920 includes three vertical columns. In the first (leftmost) column, three unit cells 725 are sequentially arranged. The second (adjacent to the leftmost column) column includes one unit cell 725 arranged vertically adjacent to two sequential unit cells 730. The third column includes three unit cells 730, sequentially arranged. In some embodiments, conductor layer 1920 includes more or less than three columns. One of ordinary skill in the art would recognize that additional variations in the pattern of unit cells 725 and unit cells 730 are within the scope of this description.

FIG. 19 (b) is a plan view of a conductor layer 1930 according to at least one embodiment. Conductor layer 1930 is similar to conductor layer 720. In comparison with conductor layer 720, conductor layer 1930 has a different pattern for unit cells 725 and unit cells 730. Conductor layer 1930 includes three vertical columns. In the first (leftmost)

column, two unit cells 725 are sequentially arranged vertically adjacent to one unit cell 730. The second (adjacent to the leftmost column) has an identical arrangement of unit cells 725 and 730 as the first column. The third column includes three unit cells 730, sequentially arranged. In some embodiments, conductor layer 1930 includes more or less than three columns. One of ordinary skill in the art would recognize that additional variations in the pattern of unit cells 725 and unit cells 730 are within the scope of this description.

Figure 20A:
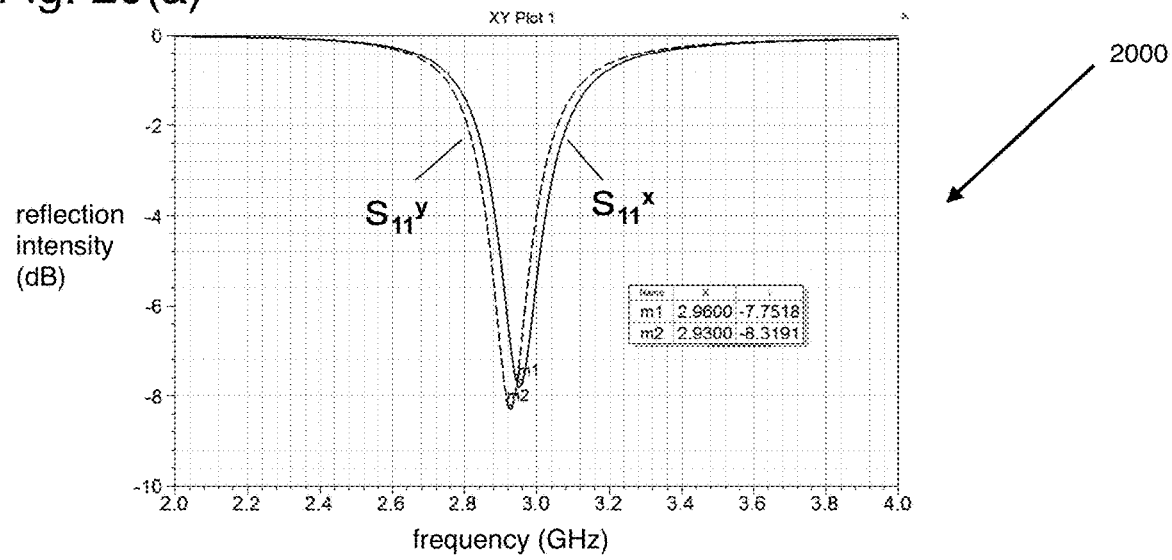
FIG. 20 (a) is a plot of reflection intensity versus frequency for an exemplary electromagnetic blocking structure according to FIG. 1 in which the first and second conductor layers are each uniform layers of serpentine unit cells in accordance with some embodiments.
Figure 20B:
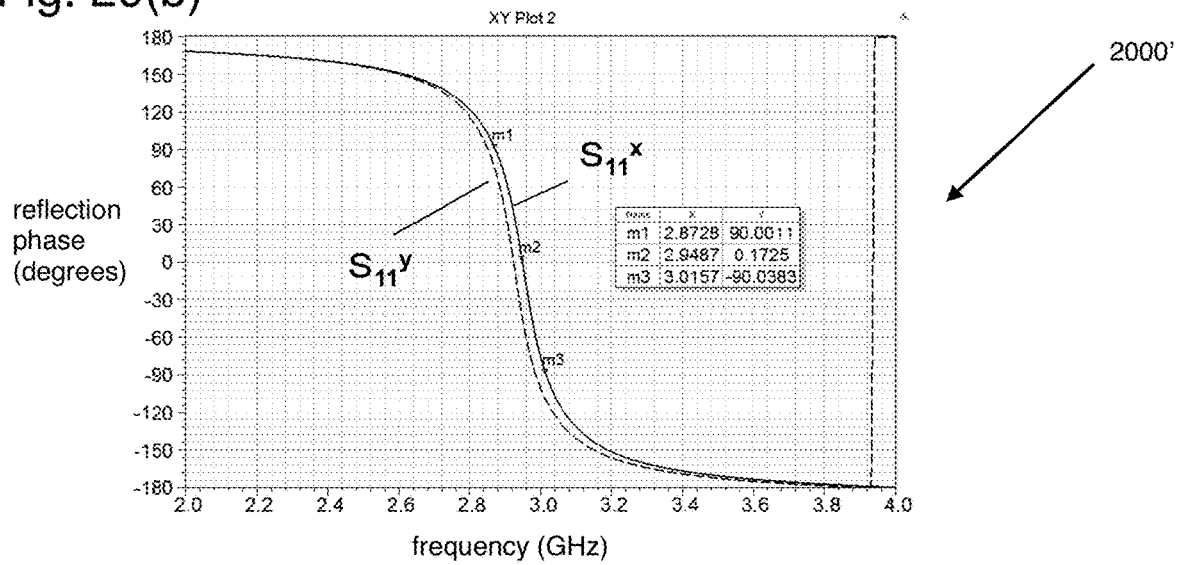

FIGS. 20 (a) and 20 (b) are a plots of EM blocking properties of an exemplary embodiments of an electromagnetic blocking structure 100 in which the first and second conductor layers comprise serpentine unit cells. The degree of overlap of the solid curve $S11^x$ and broken curve $S11^y$ in the plots relate to the degree of signal anisotropy. The suffixes x and y indicate the x-axis and y-axis direction of the electric field of the incident plane wave, respectively. Areas of greater overlap thus indicate less signal anisotropy. The dielectric material 50 had a relative dielectric constant of 4.7 and a dielectric loss tangent of 0.02, and each conductor layer was made of copper having a thickness of 18 μm. A simulation was conducted by a finite element method. The reflected wave was calculated assuming that a plane wave incident from the +z direction, e.g., perpendicular to first conductive layer 120. The simulation was carried out using the periodic boundary conditions. FIG. 20 (a) is a plot 2000 of reflection intensity of the EM blocking structure 100 as a function of frequency, and FIG. 20 (b) is a plot 2000' of the reflection phase of the electromagnetic blocking structure 100 as a function of frequency. In plot 2000', the points m1, m2 and m3 on $S11^x$ correspond to reflection phases at 90°, 0° and −90°, respectively. From these results, EM blocking effects of the electromagnetic blocking structure 100 are shown approximately at 2.87 to 3.02 GHz, indicating that there is an EM blocking bandwidth of about 150 MHz (i.e., the difference between 2.87 GHz and 3.02 GHz).

Figure 21A:
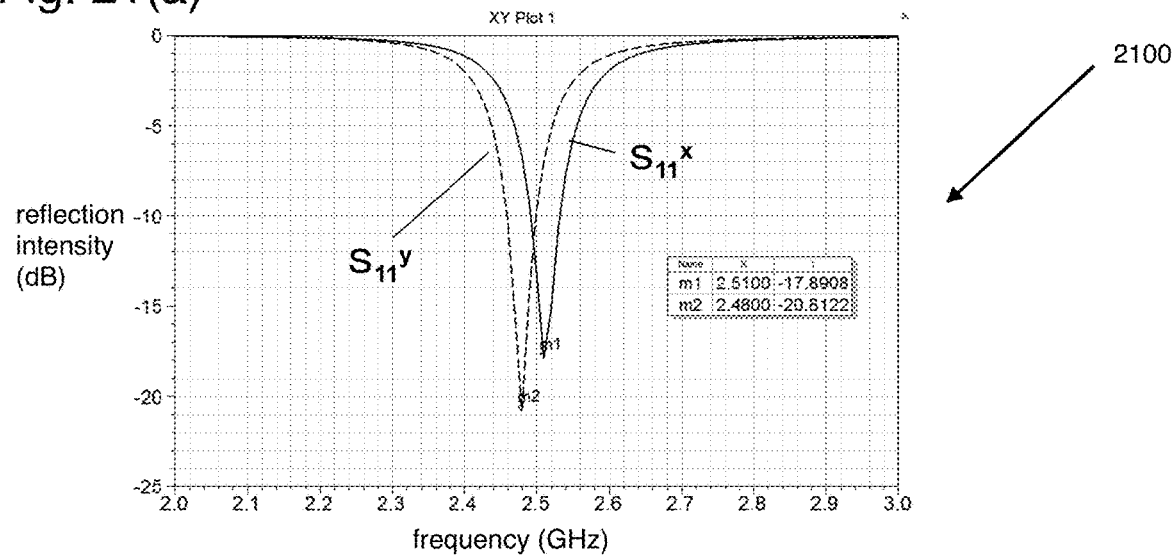
FIG. 21 (a) is a plot of reflection intensity versus frequency for an exemplary electromagnetic blocking structure according to FIG. 1 in which the first and second conductor layers are each uniform layers of point symmetric double spiral unit cells in accordance with some embodiments.
Figure 21B:
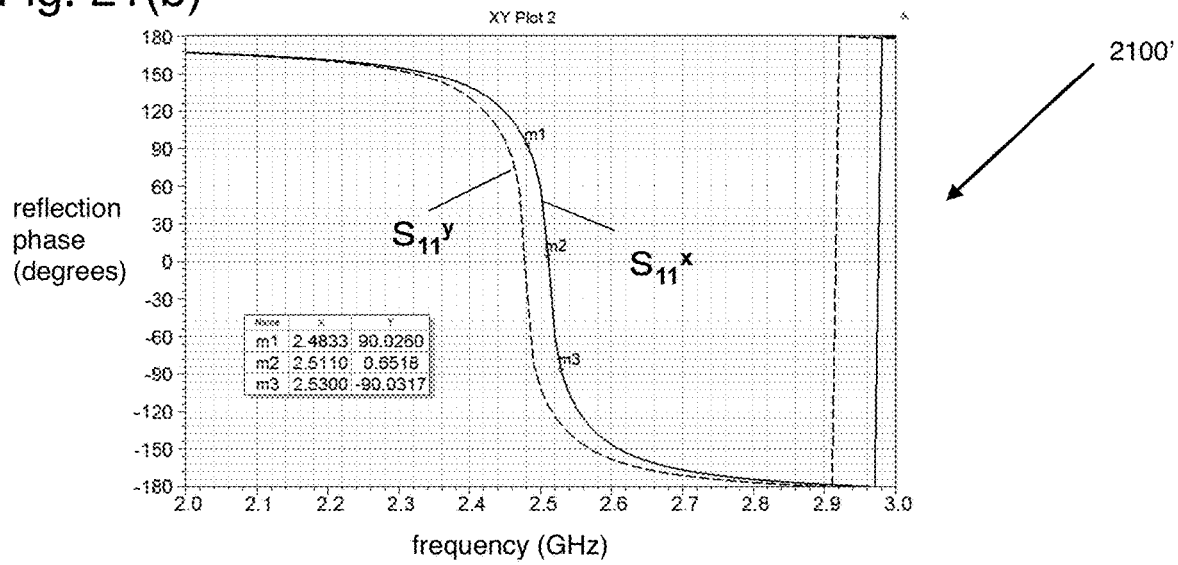

FIGS. 21 (a) and 21 (b) are plots of reflection intensity versus frequency and reflection phase versus frequency, respectively. Plots 2100 and 2100' were obtained based on an EM blocking structure having a structure similar to EM blocking structure 100 wherein unit cells 125 and 135 are similar to unit cell 500. Plots 2100 and 2100' were obtained using the finite element method described above.

Figure 22A:
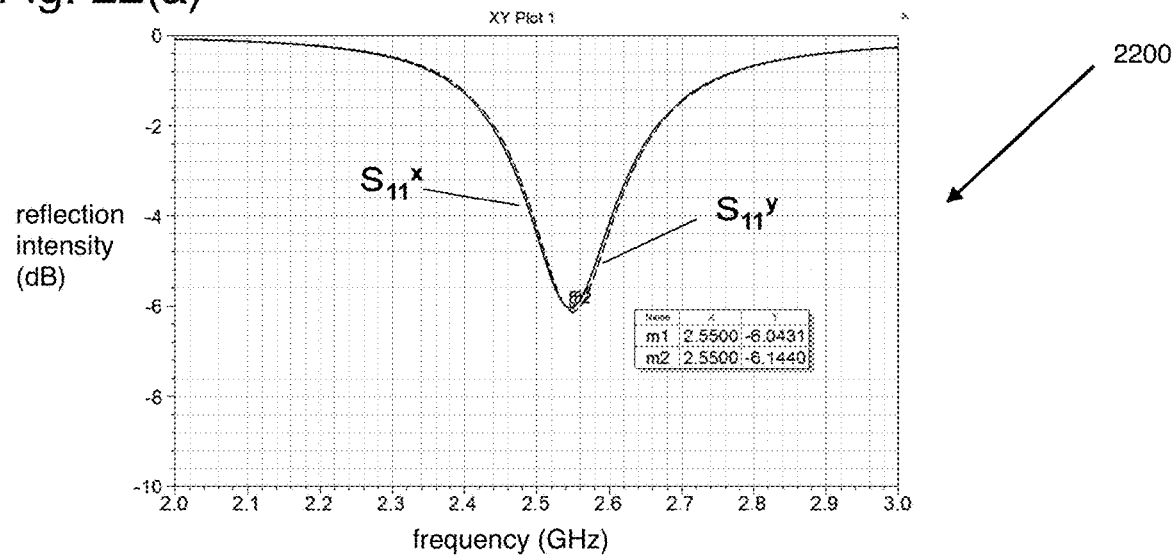
FIG. 22 (a) is a plot of reflection intensity versus frequency for an exemplary electromagnetic blocking structure according to FIG. 8 in which the first and second conductor layers are each uniform layers of serpentine unit cells in accordance with some embodiments.
Figure 22B:
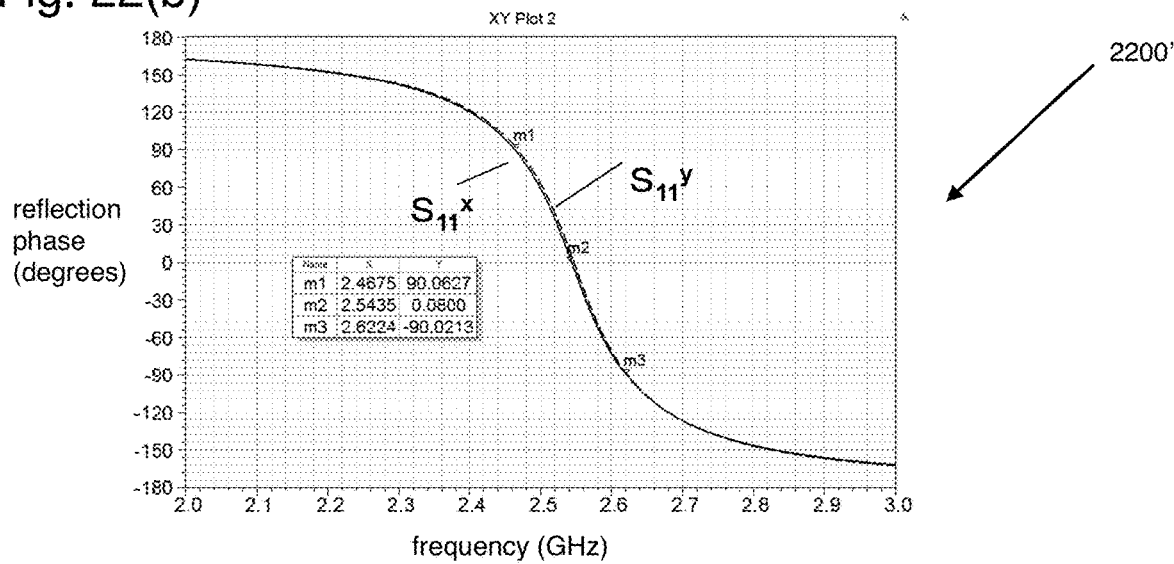

FIGS. 22 (a) and 22 (b) are plots of reflection intensity versus frequency and reflection phase versus frequency, respectively. Plots 2200 and 2200' were obtained based on an EM blocking structure having a structure similar to EM blocking structure 1500 wherein unit cells 125, 135, and 1525 are similar to unit cell 400. Plots 2200 and 2200' were obtained using the finite element method described above.

Figure 23A:
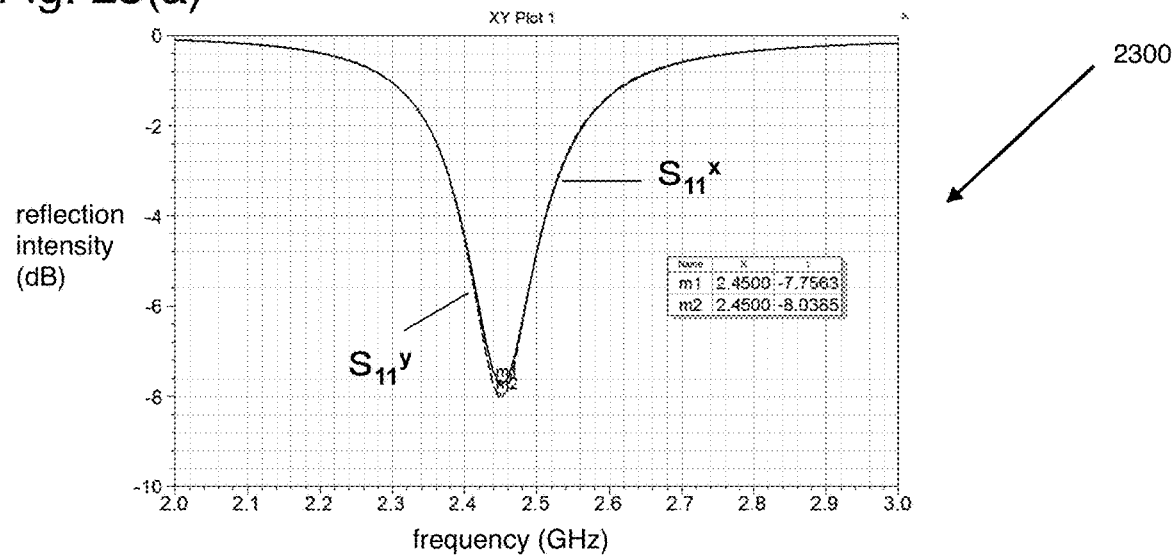
FIG. 23 (a) is a plot of reflection intensity versus frequency for an exemplary electromagnetic blocking structure according to FIG. 8 in which the first and second conductor layers are each uniform layers of point symmetric double spiral unit cells in accordance with some embodiments.
Figure 23B:
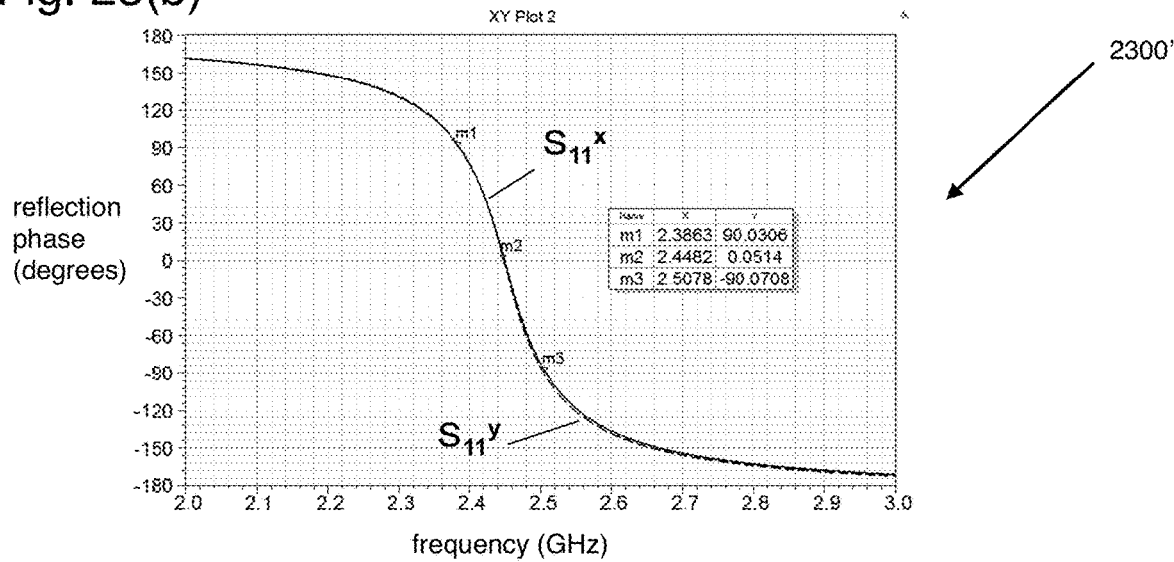

FIGS. 23 (a) and 23 (b) are plots of reflection intensity versus frequency and reflection phase versus frequency, respectively. Plots 2300 and 2300' were obtained based on a EM blocking structure having a structure similar to EM blocking structure 1500 wherein unit cells 125 and 1525 are similar to unit cell 500 and unit cells 135 are similar to unit cell 900. Plots 2300 and 2300' were obtained using the finite element method described above.

Figure 24A:
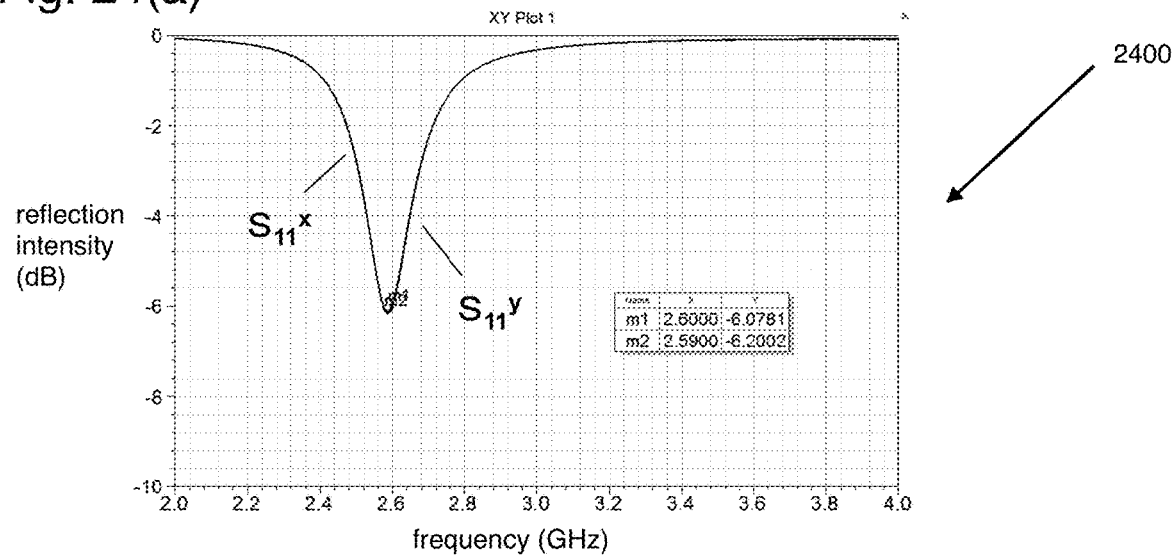
FIG. 24 (a) is a plot of reflection intensity versus frequency for an exemplary electromagnetic blocking structure according to FIG. 8 in which the first and second conductor layers are each uniform layers of line symmetric double spiral unit cells in accordance with some embodiments.
Figure 24B:
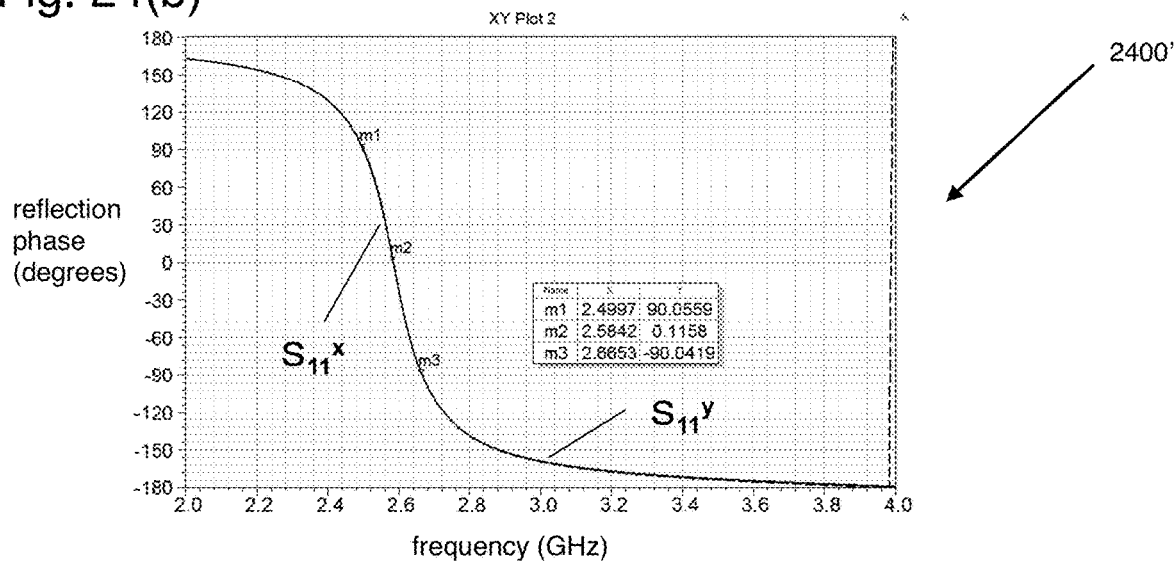

FIGS. 24 (a) and 24 (b) are plots of reflection intensity versus frequency and reflection phase versus frequency, respectively. Plots 2400 and 2400' were obtained based on a EM blocking structure having a structure similar to EM blocking structure 1500 wherein unit cells 125 and 1525 are similar to unit cell 600 and unit cells 135 are similar to unit cell 900. Plots 2400 and 2400' were obtained using the finite element method described above.

Figure 25A:
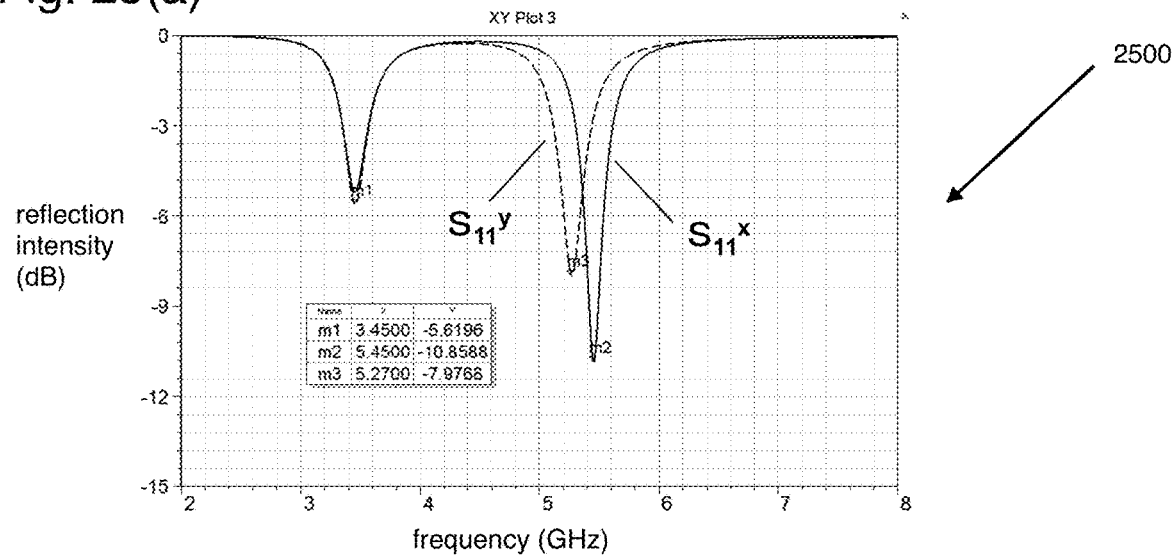
FIG. 25 (a) is a plot of reflection intensity versus frequency for an exemplary electromagnetic blocking structure according to FIG. 8 in which the first and second conductor layers are each uniform layers of serpentine unit cells, and the patch layer is a uniform layer of loop structure unit cells in accordance with some embodiments.
Figure 25B:
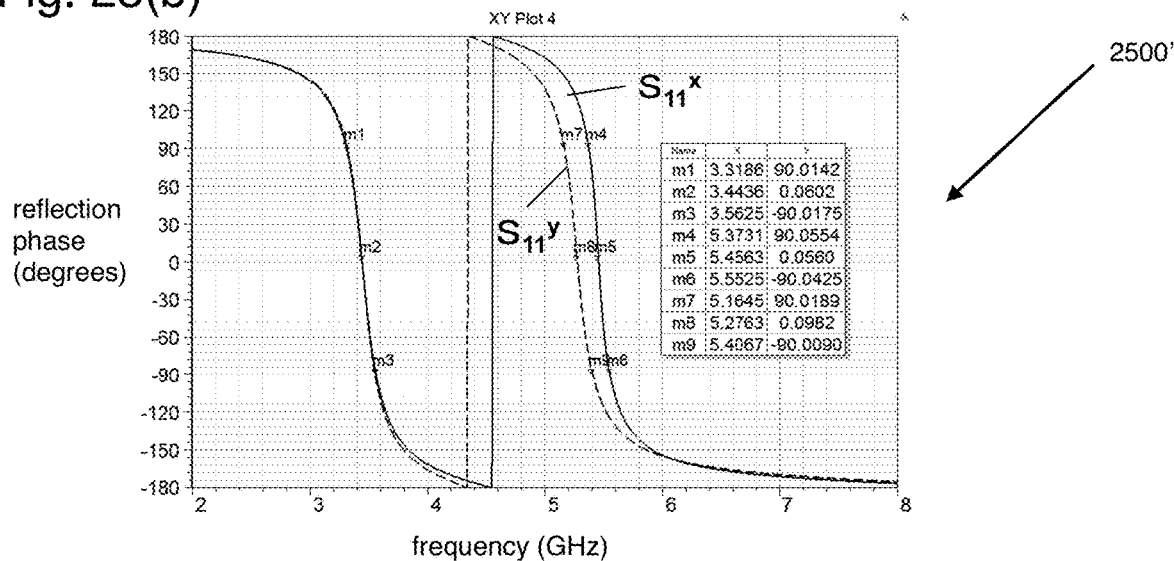

FIGS. 25 (a) and 25 (b) plots of reflection intensity versus frequency and reflection phase versus frequency, respectively. Plots 2500 and 2500' were obtained based on a EM blocking structure having a structure similar to EM blocking structure 1500 wherein unit cells 125 and 1525 are similar to unit cell 400 and unit cells 135 are similar to unit cell 1000. Plots 2500 and 2500' were obtained using the finite element method described above.

Figure 26A:
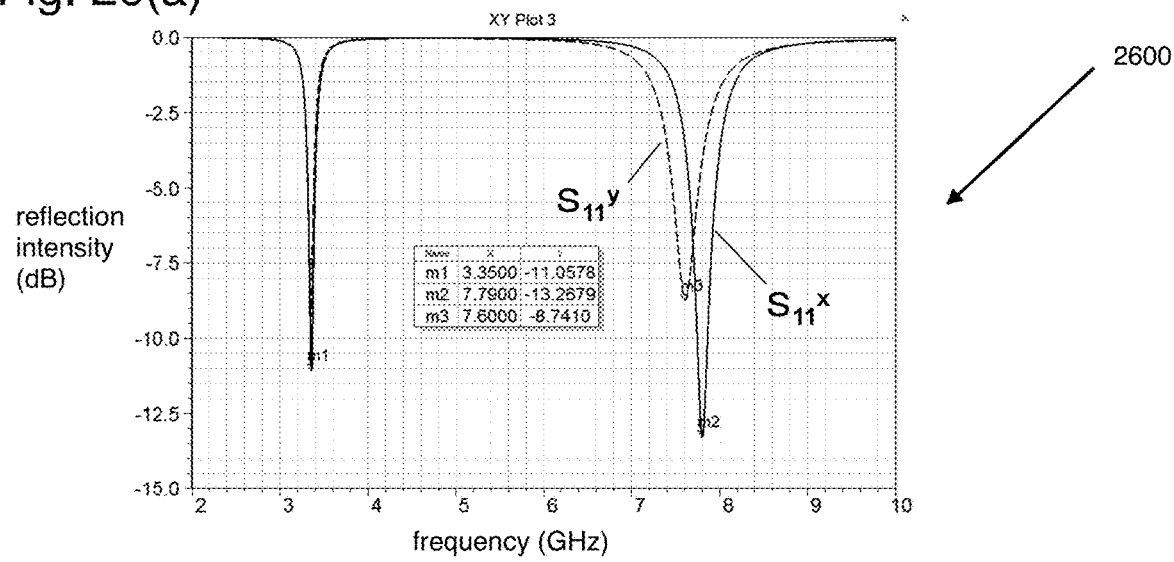
FIG. 26 (a) is a plot of reflection intensity versus frequency for an exemplary electromagnetic blocking structure according to FIG. 8 in which the first and second conductor layers are each uniform layers of serpentine unit cells, and the patch layer is a uniform layer of loop slot unit cells in accordance with some embodiments.
Figure 26B:
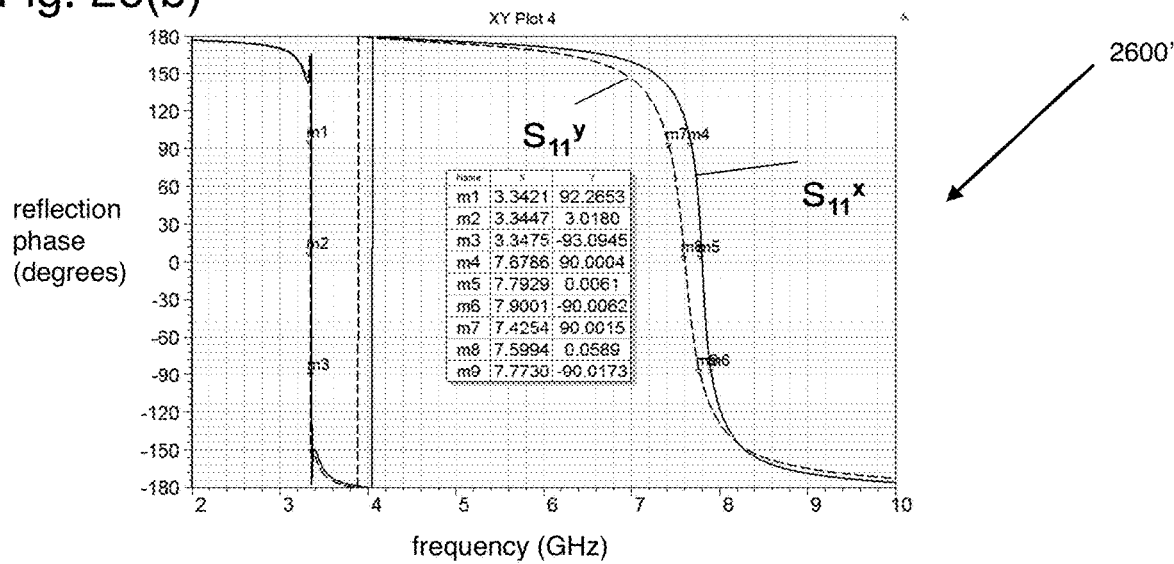

FIGS. 26 (a) and 26 (b) are plots of reflection intensity versus frequency and reflection phase versus frequency, respectively. Plots 2600 and 2600' were obtained based on a EM blocking structure having a structure similar to EM blocking structure 1500 wherein unit cells 125 and 1525 are similar to unit cell 400 and unit cells 135 are similar to unit cell 1100. Plots 2600 and 2600' were obtained using the finite element method described above.

Figure 27A:
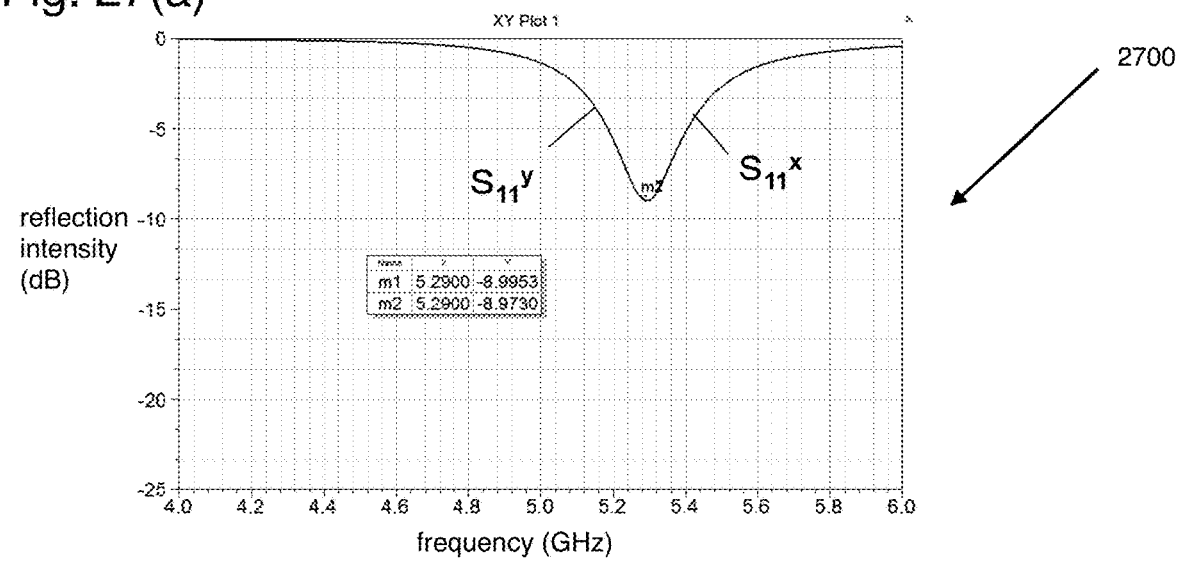
FIG. 27 (a) is a plot of reflection intensity versus frequency for an exemplary electromagnetic blocking structure according to FIG. 7 in which the conductor layer is a uniform layer of serpentine unit cells in accordance with some embodiments.
Figure 27B:
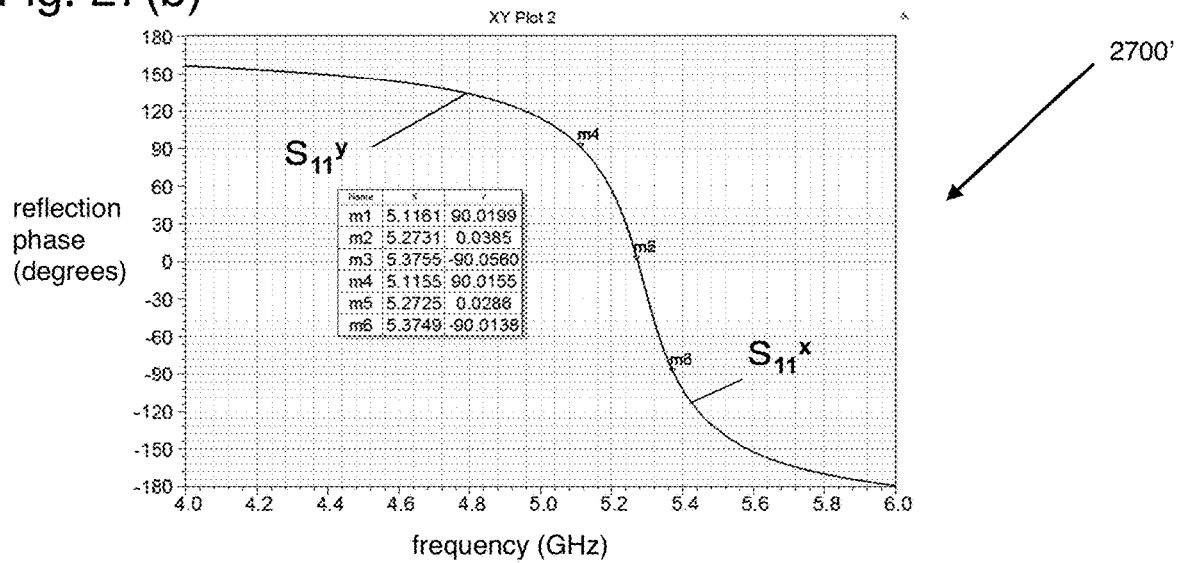

FIGS. 27 (a) and 27 (b) are plots of reflection intensity versus frequency and reflection phase versus frequency, respectively. Plots 2700 and 2700' were obtained based on an EM blocking structure having a structure similar to EM blocking structure 700 wherein unit cells 725 and 730 are similar to unit cell 400. Plots 2700 and 2700' were obtained using the finite element method described above.

Figure 28A:
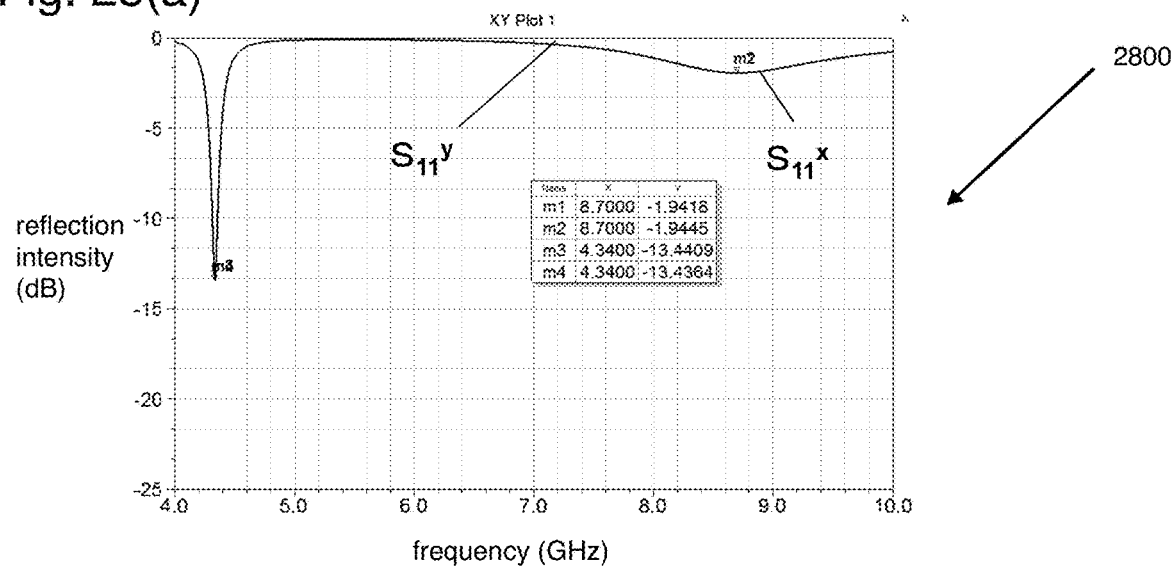
FIG. 28 (a) is a plot of reflection intensity versus frequency for an exemplary electromagnetic blocking structure according to FIG. 7 in which the conductor layer is a uniform layer of point symmetric double spiral unit cells in accordance with some embodiments.
Figure 28B:
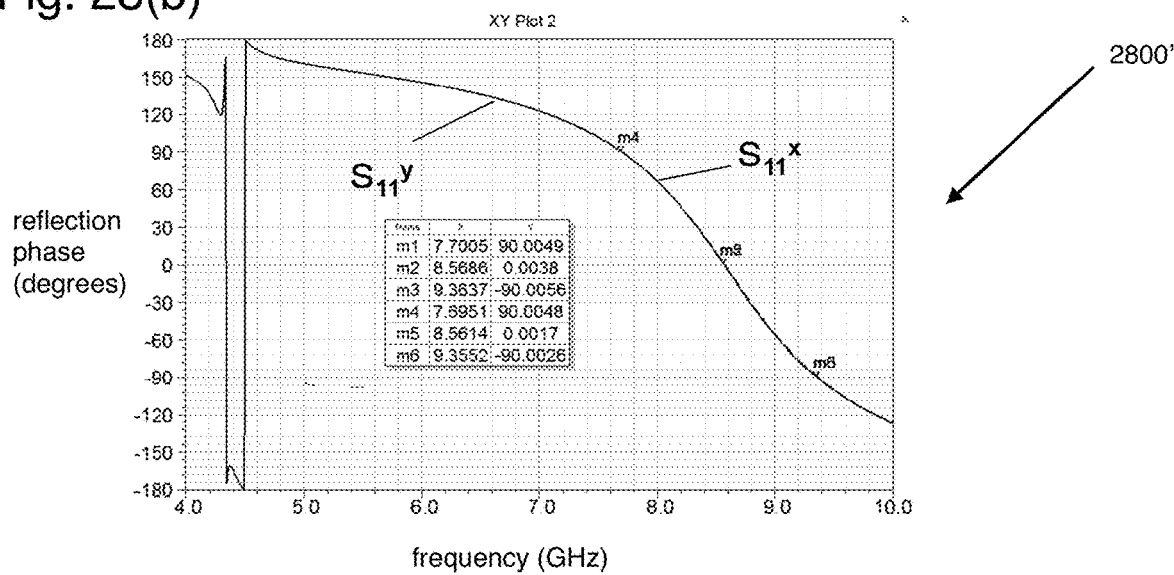

FIGS. 28 (a) and 28 (b) are plots of reflection intensity versus frequency and reflection phase versus frequency, respectively. Plots 2800 and 2800' were obtained based on an EM blocking structure having a structure similar to EM blocking structure 700 wherein unit cells 725 and 730 are similar to unit cell 500. Plots 2800 and 2800' were obtained using the finite element method described above.

Figure 29A:
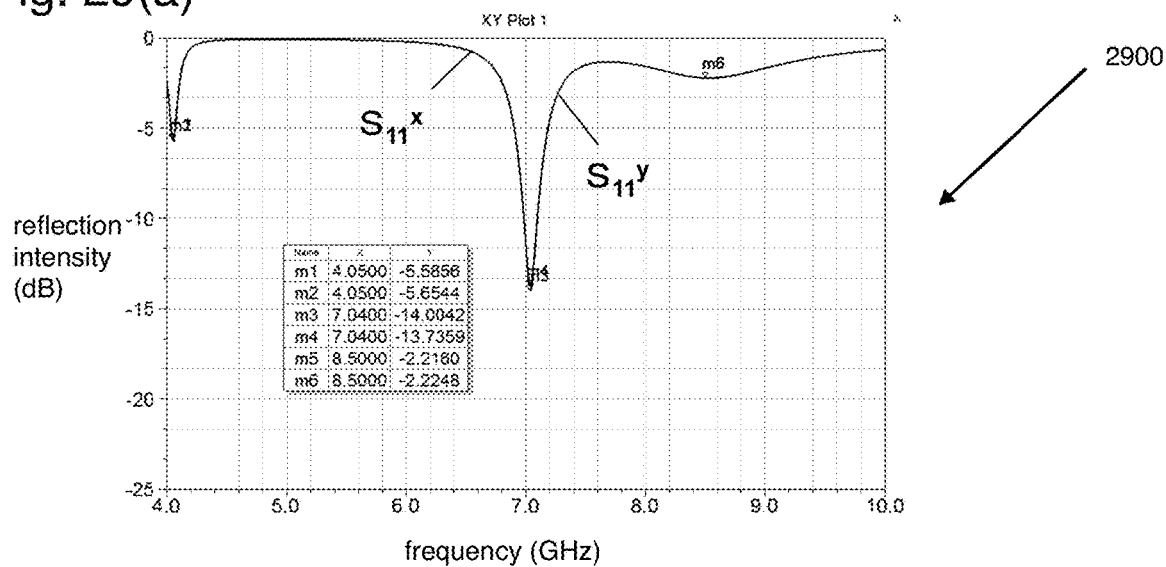
FIG. 29 (a) is a plot of reflection intensity versus frequency for an exemplary electromagnetic blocking structure according to FIG. 7 in which the conductor layer is a uniform layer of line symmetric double spiral unit cells in accordance with some embodiments.
Figure 29B:
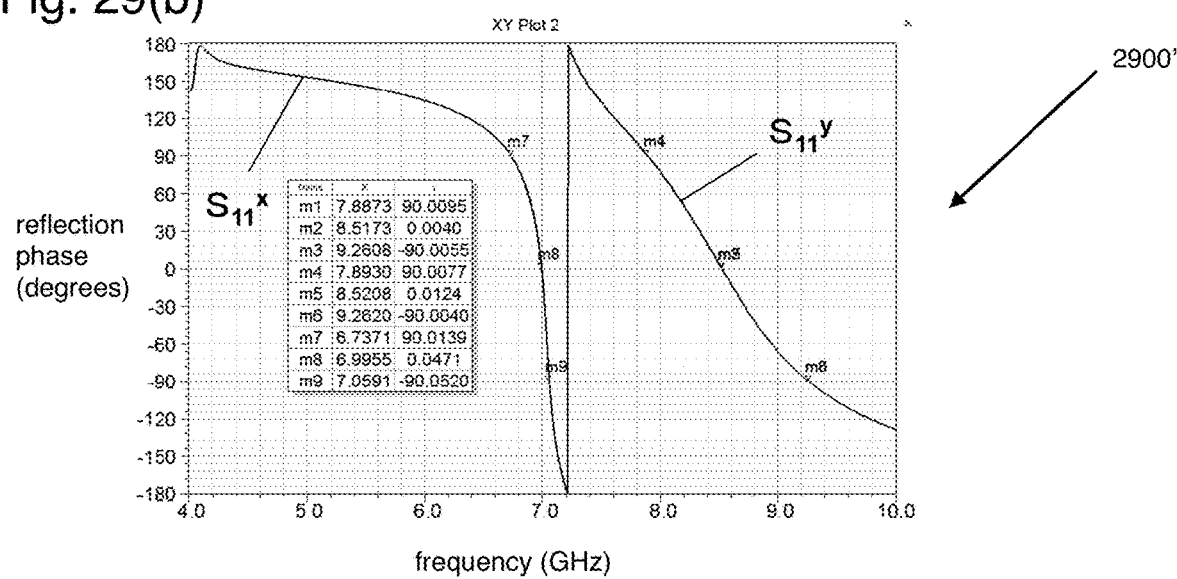

FIGS. 29 (a) and 29 (b) are plots of reflection intensity versus frequency and reflection phase versus frequency, respectively. Plots 2900 and 2900' were obtained based on an EM blocking structure having a structure similar to EM blocking structure 700 wherein unit cells 725 and 730 are similar to unit cell 600. Plots 2900 and 2900' were obtained using the finite element method described above.

Figure 30A:
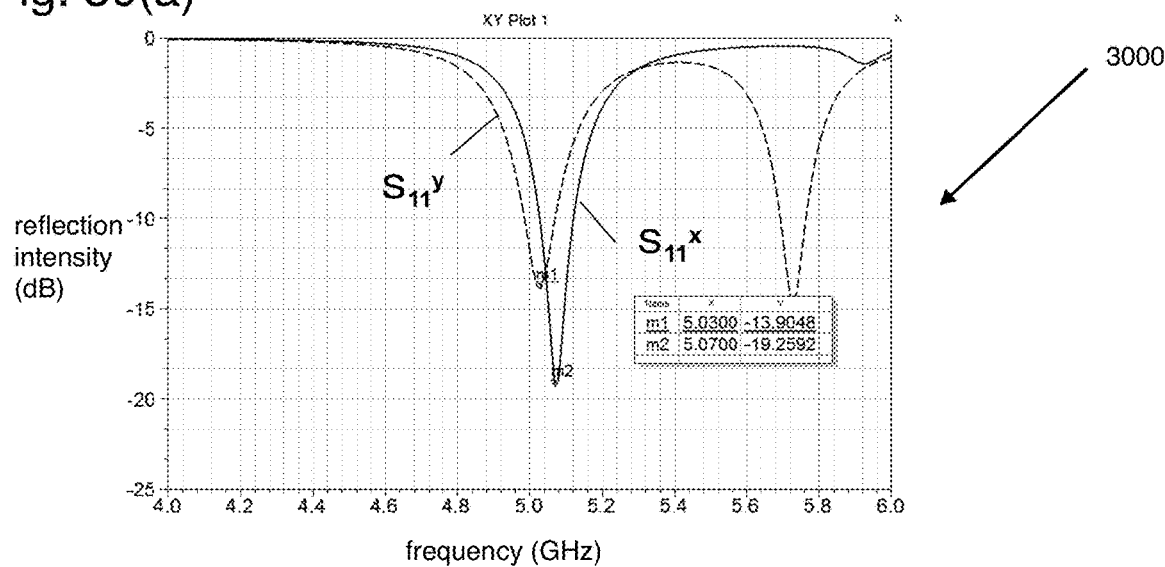
FIG. 30 (a) is a plot of reflection intensity versus frequency for an exemplary electromagnetic blocking structure according to FIG. 17 in which the conductor layer is a uniform layer of serpentine unit cells in accordance with some embodiments.
Figure 30B:
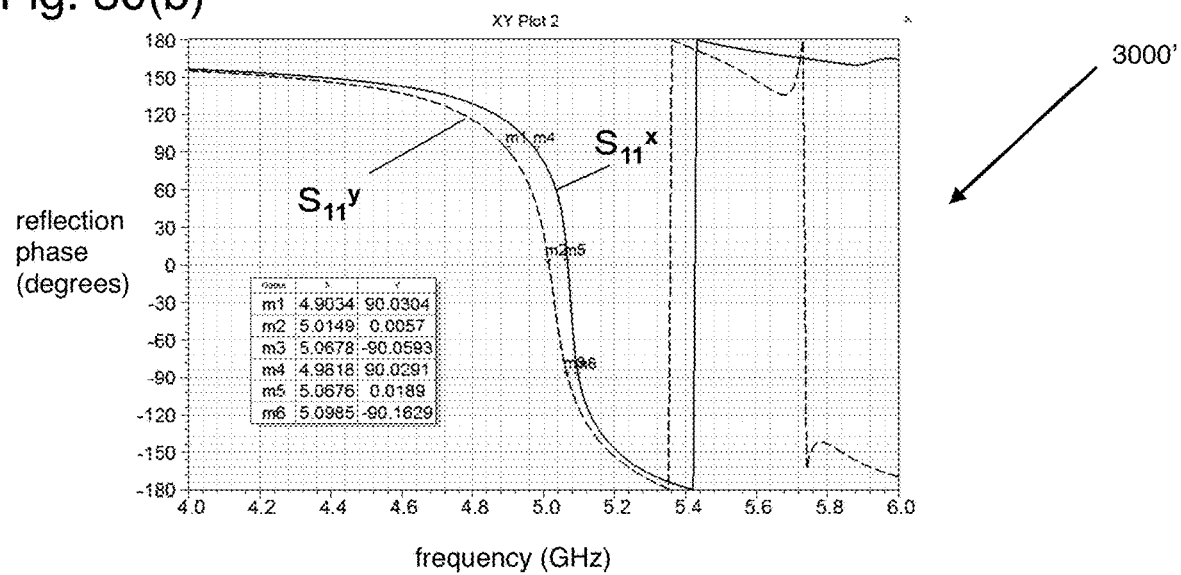

FIGS. 30 (a) and 30 (b) are plots of reflection intensity versus frequency and reflection phase versus frequency, respectively. Plots 3000 and 3000' were obtained based on an EM blocking structure having a structure similar to EM blocking structure 1700 wherein unit cells 725 and 730 are similar to unit cell 400. Plots 3000 and 3000' were obtained using the finite element method described above.

Figure 31A:
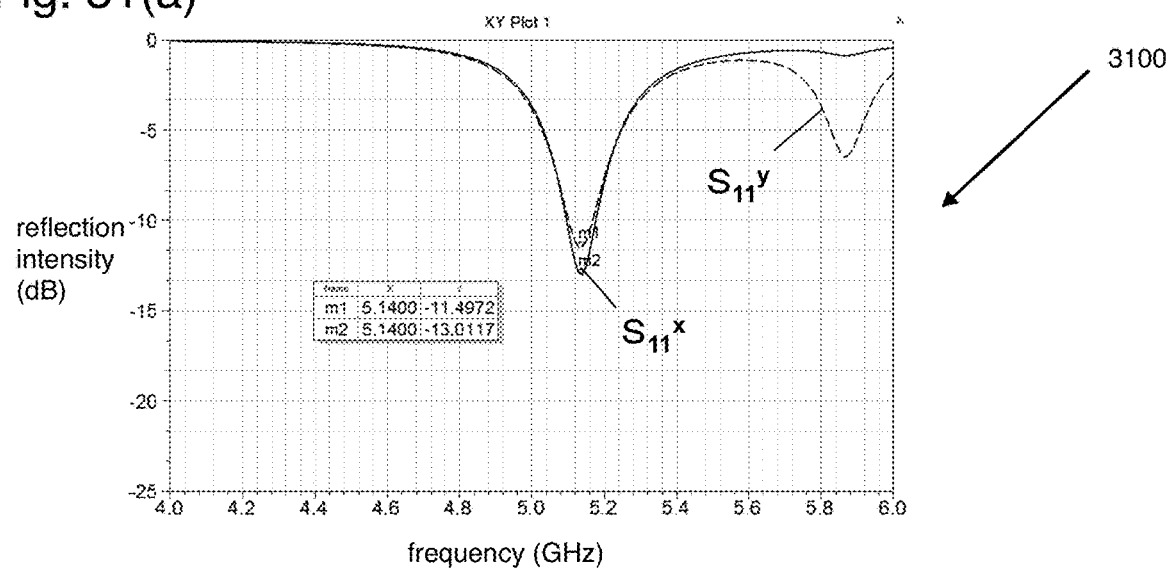
FIG. 31 (a) is a plot of reflection intensity versus frequency for an exemplary electromagnetic blocking structure according to FIG. 7 in which the conductor layer is a 3×3 uniform layer of serpentine unit cells in accordance with some embodiments.
Figure 31B:
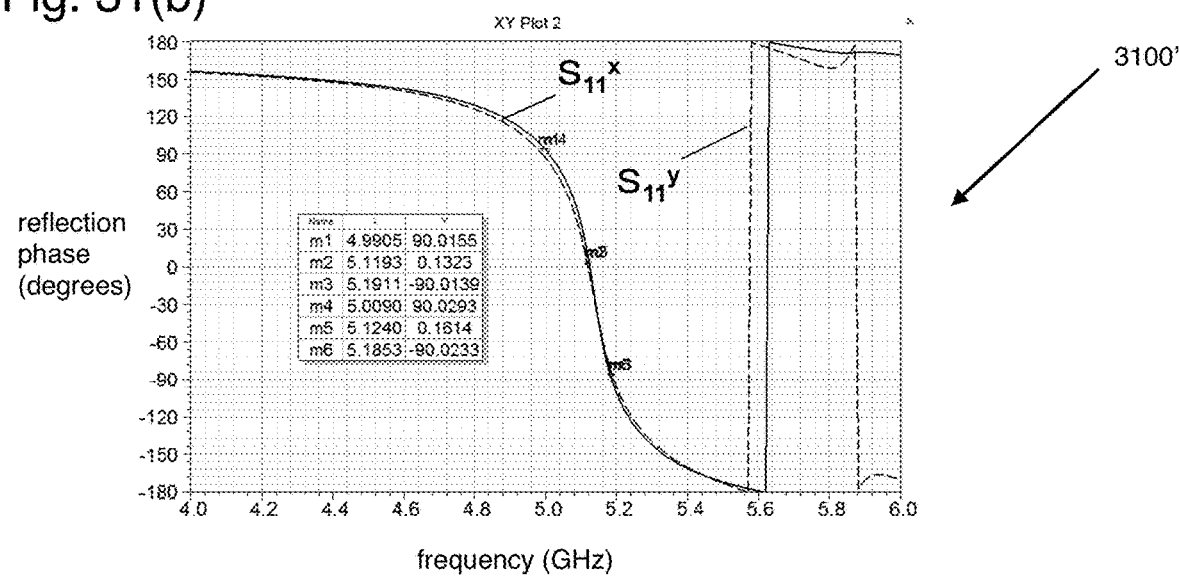

FIGS. 31 (a) and 31 (b) are plots of reflection intensity versus frequency and reflection phase versus frequency, respectively. Plots 3100 and 3100' were obtained based on a EM blocking structure having a structure similar to EM blocking structure 700 wherein unit cells 725 and 730 are similar to unit cell 400 and layer 720 is a 3×3 layer comprising four unit cells 725 and five unit cells 730. Plots 3100 and 3100' were obtained using the finite element method described above.

Figure 32A:
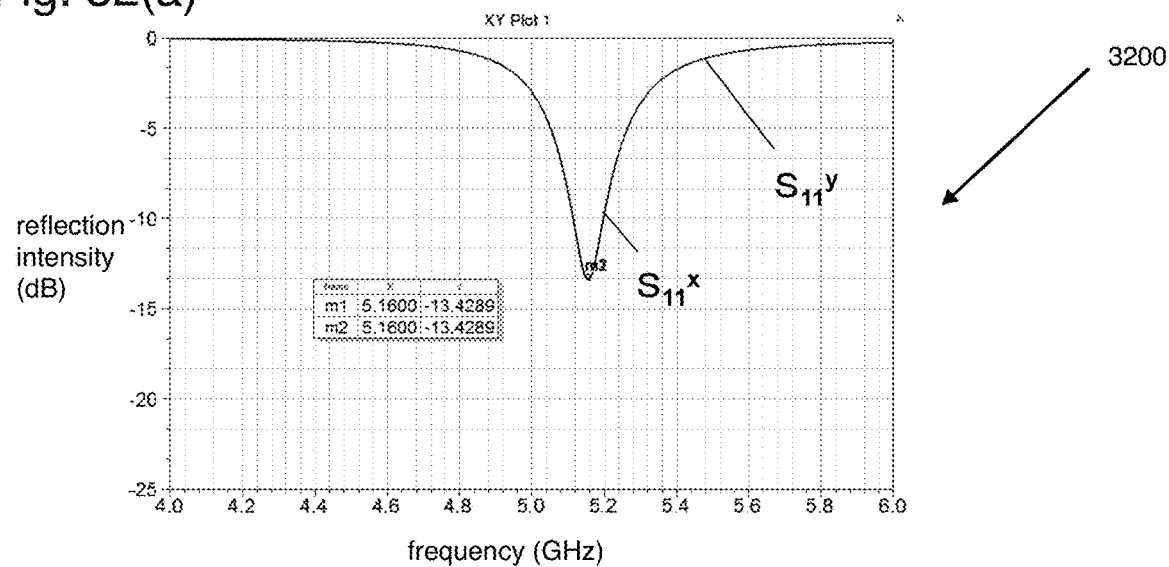
FIG. 32 (a) is a plot of reflection intensity versus frequency for an exemplary electromagnetic blocking structure according to FIG. 13 in accordance with some embodiments.
Figure 32B:
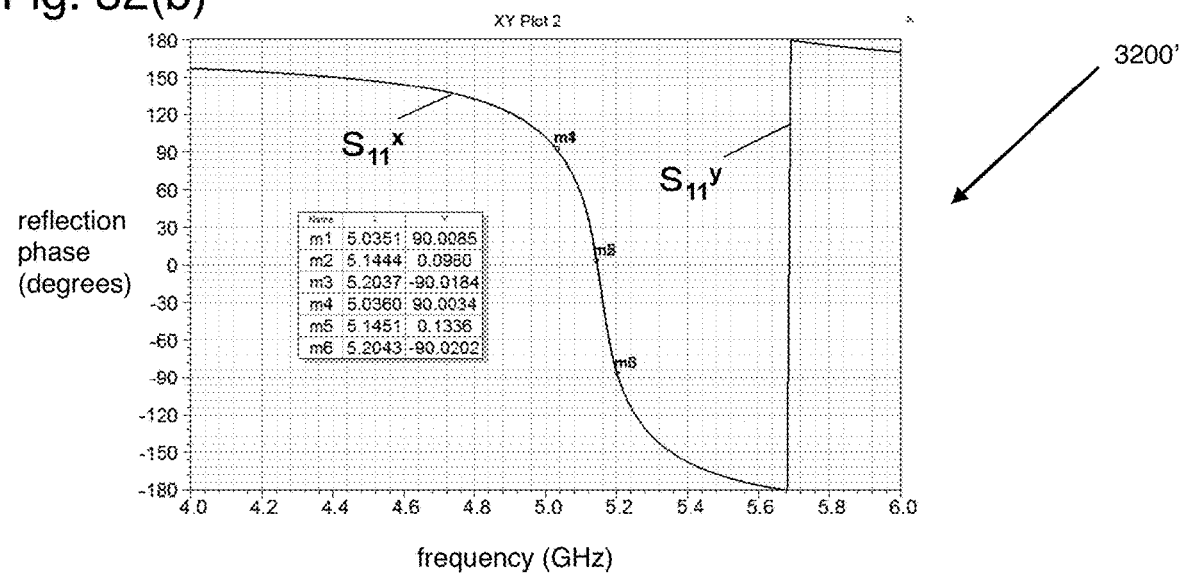

FIGS. 32 (a) and 32 (b) are plots of reflection intensity versus frequency and reflection phase versus frequency, respectively. Plots 3200 and 3200' were obtained based on an EM blocking structure having a structure similar to EM blocking structure 1300 wherein unit cells 1325 and 1330 are similar to unit cell 400. Plots 3200 and 3200' were obtained using the finite element method described above.

Figure 33A:
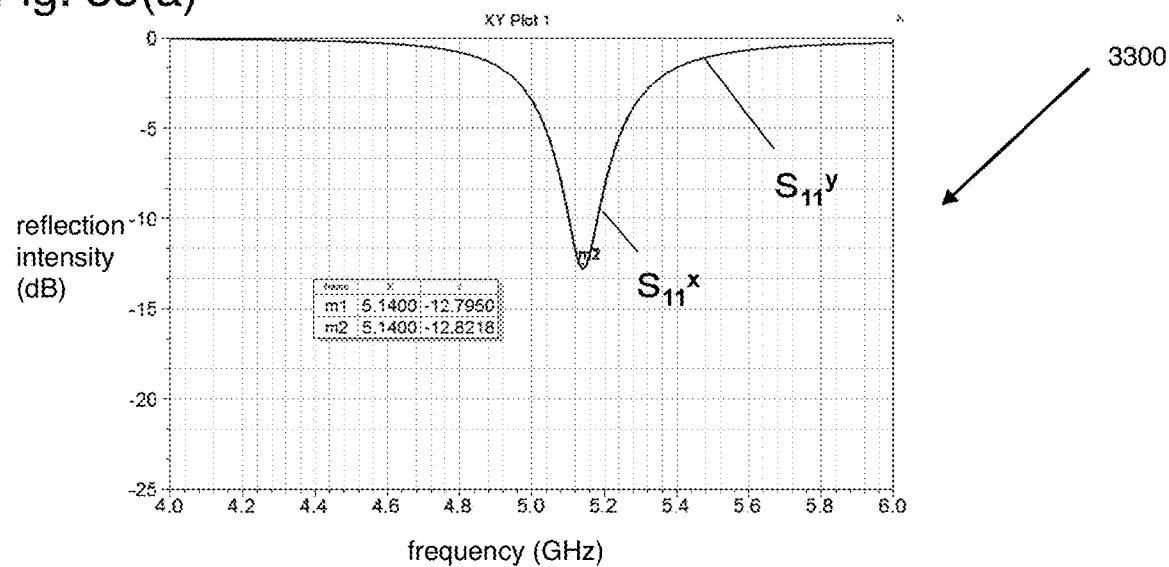
FIG. 33 (a) is a plot of reflection intensity versus frequency for an exemplary electromagnetic blocking structure according to FIG. 14 in accordance with some embodiments.
Figure 33B:
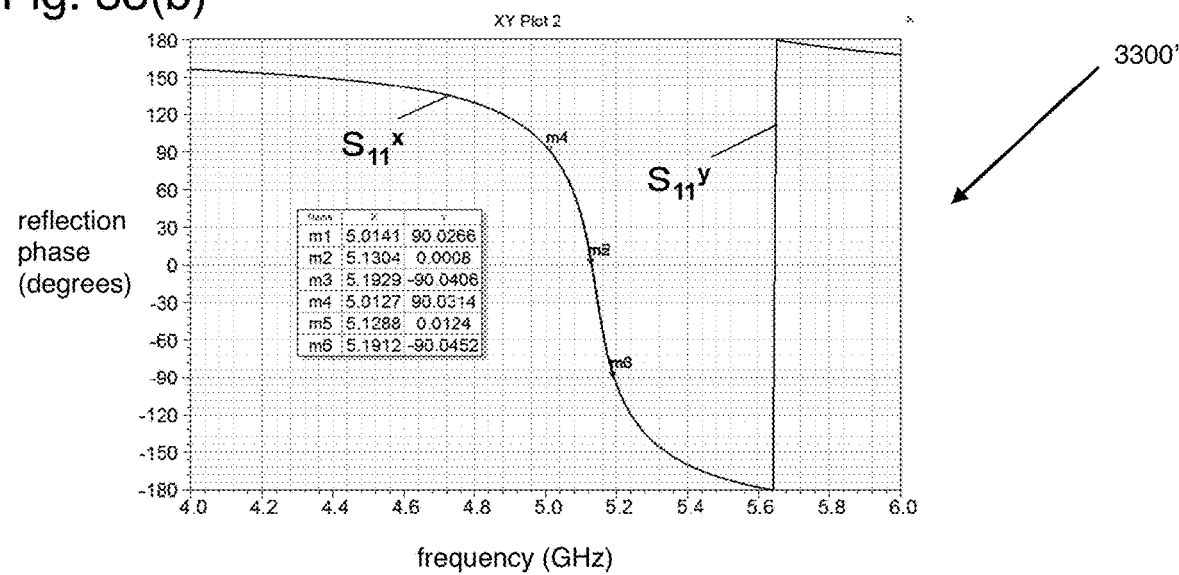

FIGS. 33 (a) and 33 (b) are plots of reflection intensity versus frequency and reflection phase versus frequency, respectively. Plots 3300 and 3300' were obtained based on a EM blocking structure having a structure similar to EM blocking structure 1400 wherein unit cells 1325 and 1330 are similar to unit cell 400 and unit cell 1435 is similar to unit cell 900. Plots 3300 and 3300' were obtained using the finite element method described above.

Figure 34A:
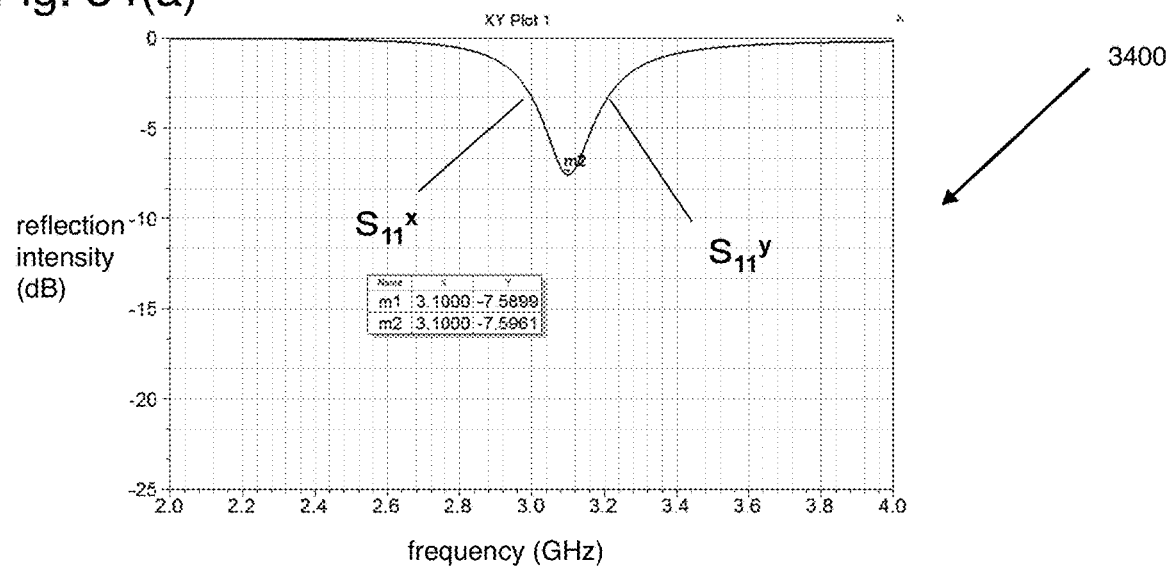
FIG. 34 (a) is a plot of reflection intensity versus frequency for an exemplary electromagnetic blocking structure according to FIG. 12 (a) in accordance with some embodiments.
Figure 34B:
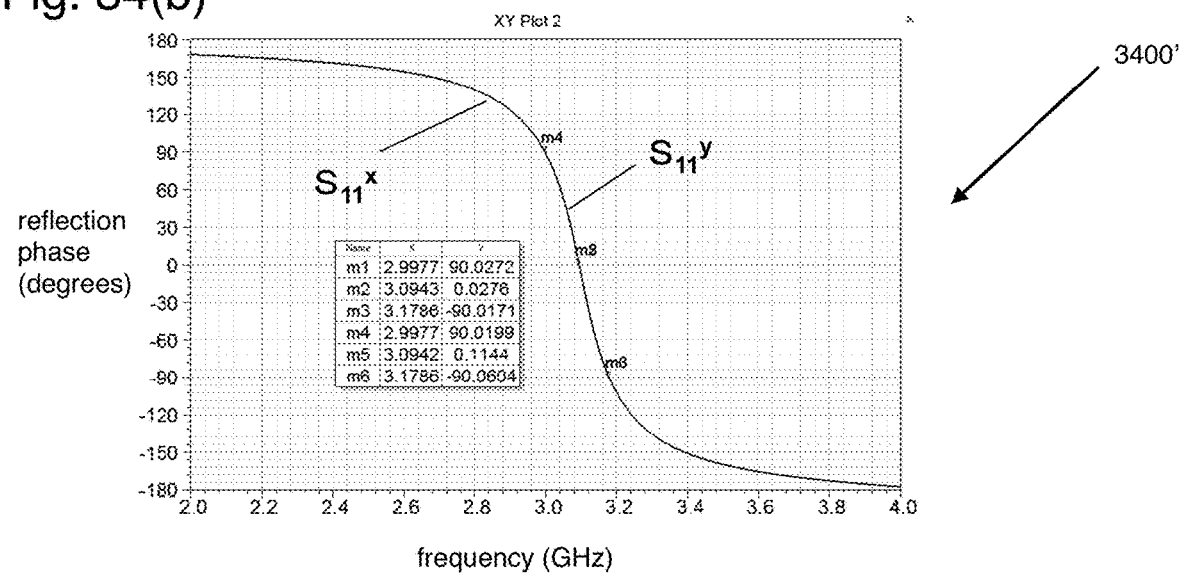

FIGS. 34 (a) and 34 (b) are plots of reflection intensity versus frequency and reflection phase versus frequency, respectively. Plots 3400 and 3400' were obtained based on a EM blocking structure having a structure similar to EM blocking structure 1200 wherein unit cells 725 and 730 are similar to unit cell 400 and unit cells 1235 are similar to unit cell 900. Plots 3400 and 3400' were obtained using the finite element method described above.

Figure 35A:
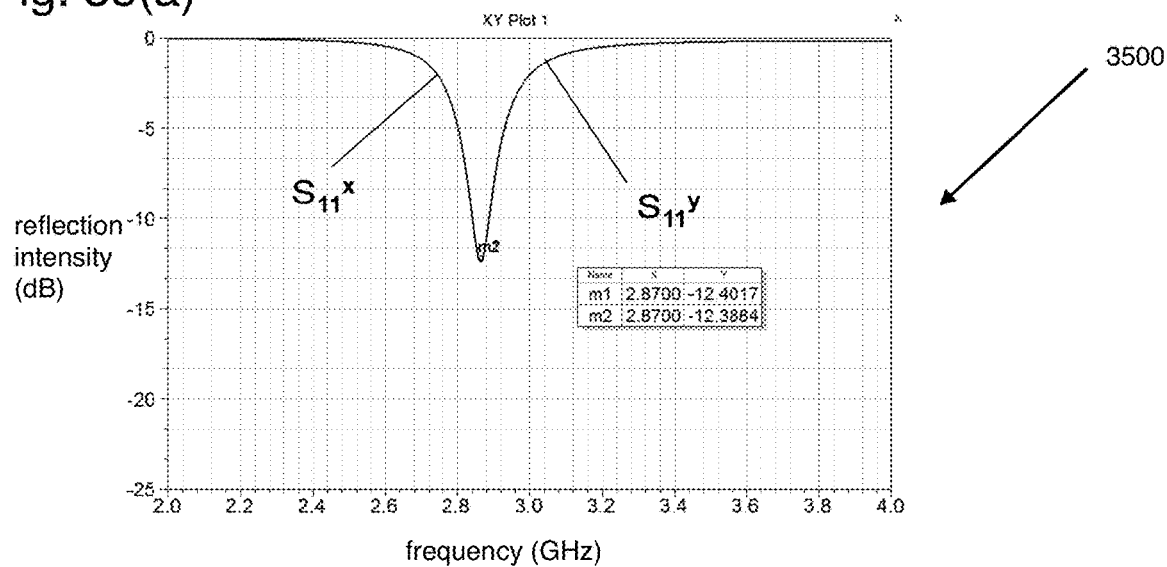
FIG. 35 (a) is a plot of reflection intensity versus frequency for an exemplary electromagnetic blocking structure according to FIG. 12 (a) in which the first conductor layer is a uniform layer of point symmetric double spiral unit cells, and the second conductor layer is a uniform layer of patch unit cells in accordance with some embodiments.
Figure 35B:
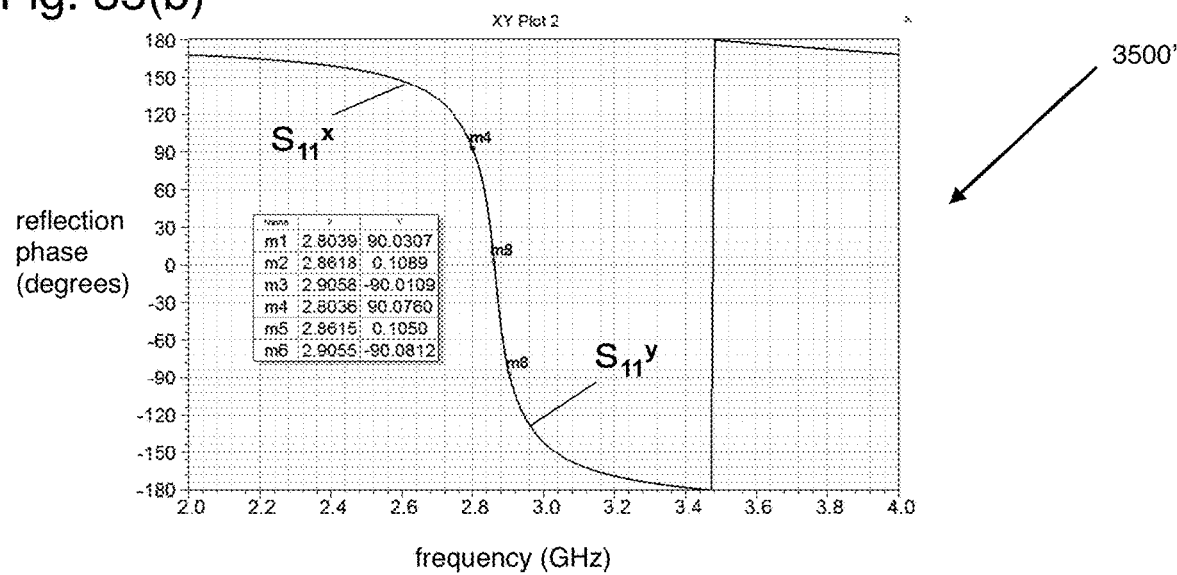

FIGS. 35 (a) and 35 (b) are plots of reflection intensity versus frequency and reflection phase versus frequency, respectively. Plots 3500 and 3500' were obtained based on a EM blocking structure having a structure similar to EM blocking structure 1200 wherein unit cells 725 and 730 are similar to unit cell 500 and unit cells 1235 are similar to unit cell 900. Plots 3500 and 3500' were obtained using the finite element method described above.

1230. Center frequency is set to the minimum value of the intensity of $S11^y$. The shift amount % is determined by an amount of offset of unit cells, e.g., unit cells 725 and unit cells 730, relative to patch cells, e.g., patch cells 1235, expressed as a percentage of a width of the unit cells. Plot 3900 was obtained based on a EM blocking structure having a structure similar to EM blocking structure 1200 wherein unit cells 725 and 730 are similar to unit cell 400 and unit cells 1235 are similar to unit cell 900. Plot 3900 was obtained using the finite element method described above. The y-axis on the right side of the plot shows the frequency of the observed isotropic band expressed in megahertz (MHz). This data is also expressed numerically in Table 1 (below). In Table 1, it can be seen that EM blocking effects begin to manifest at about 11% shift amount (11.43 in the shift amount % column), which relates to a shift of 12% to 88% of a diagonal distance of a unit cell. Thus, EM blocking effects are observed between 12% to 88% shift amount.

TABLE 1

| shift amount | x-direction frequency (GHz) | | | y-direction frequency (GHz) | | | isotropic band | |
|---|---|---|---|---|---|---|---|---|
| (%) | +90° | 0° | −90° | +90° | 0° | −90° | (MHz) | result |
| 50.00 | 2.9977 | 3.0942 | 3.1786 | 2.9977 | 3.0943 | 3.1786 | 181 | ○ |
| 35.71 | 3.1002 | 3.2022 | 3.2900 | 3.1017 | 3.2042 | 3.2928 | 188 | ○ |
| 28.57 | 3.2290 | 3.3372 | 3.4283 | 3.2149 | 3.3203 | 3.4283 | 199 | ○ |
| 21.43 | 3.4684 | 3.5829 | 3.6699 | 3.4753 | 3.5918 | 3.6801 | 212 | ○ |
| 14.29 | 3.7647 | 3.8604 | 3.9074 | 3.7855 | 3.8879 | 3.9408 | 122 | ○ |
| 13.57 | 3.8061 | 3.8982 | 3.9376 | 3.8301 | 3.9293 | 3.9753 | 108 | ○ |
| 12.86 | 3.8526 | 3.9407 | 3.9700 | 3.8750 | 3.9692 | 4.0060 | 95 | ○ |
| 12.14 | 3.9038 | 3.9845 | 4.0030 | 3.9269 | 4.0133 | 4.0384 | 76 | ○ |
| 11.43 | 3.9584 | 4.0332 | 4.0385 | 3.9842 | 4.0616 | 4.0708 | 54 | ○ |
| 10.71 | — | — | — | — | — | — | — | X |
| 7.14 | — | — | — | — | — | — | — | X |
| 0.0 | — | — | — | — | — | — | — | X |

Figure 36A:
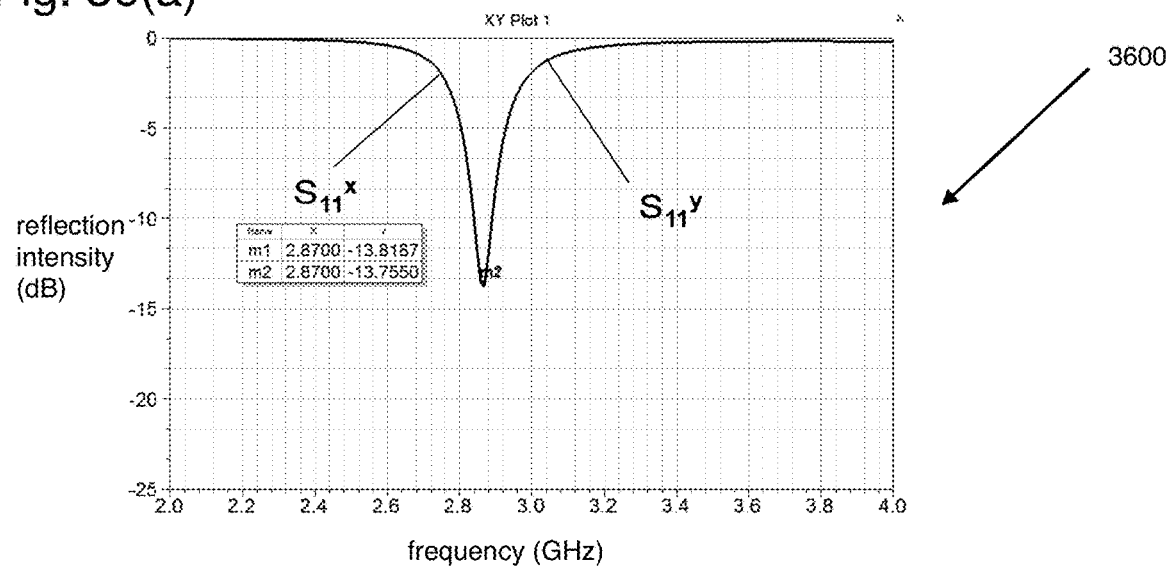
FIG. 36 (a) is a plot of reflection intensity versus frequency for an exemplary electromagnetic blocking structure according to FIG. 12 (a) in which the first conductor layer is a uniform layer of line symmetric double spiral unit cells, and the second conductor layer is a uniform layer of patch unit cells in accordance with some embodiments.
Figure 36B:
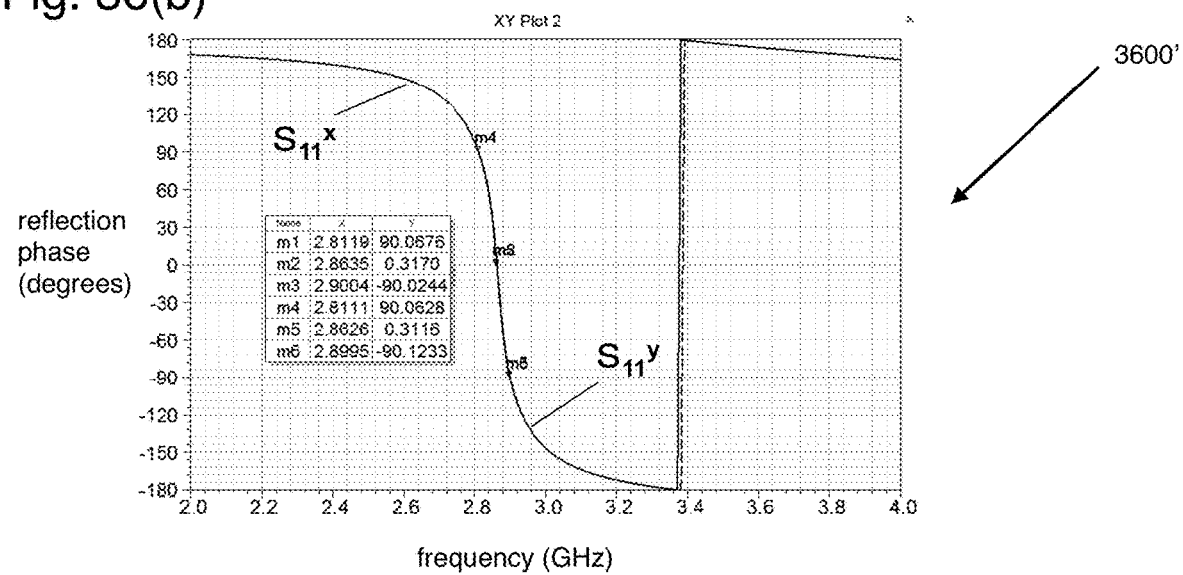

FIGS. 36 (a) and 36 (b) are plots of reflection intensity versus frequency and reflection phase versus frequency, respectively. Plots 3600 and 3600' were obtained based on a EM blocking structure having a structure similar to EM blocking structure 1200 wherein unit cells 725 and 730 are similar to unit cell 600 and unit cells 1235 are similar to unit cell 900. Plots 3600 and 3600' were obtained using the finite element method described above.

Figure 37A:
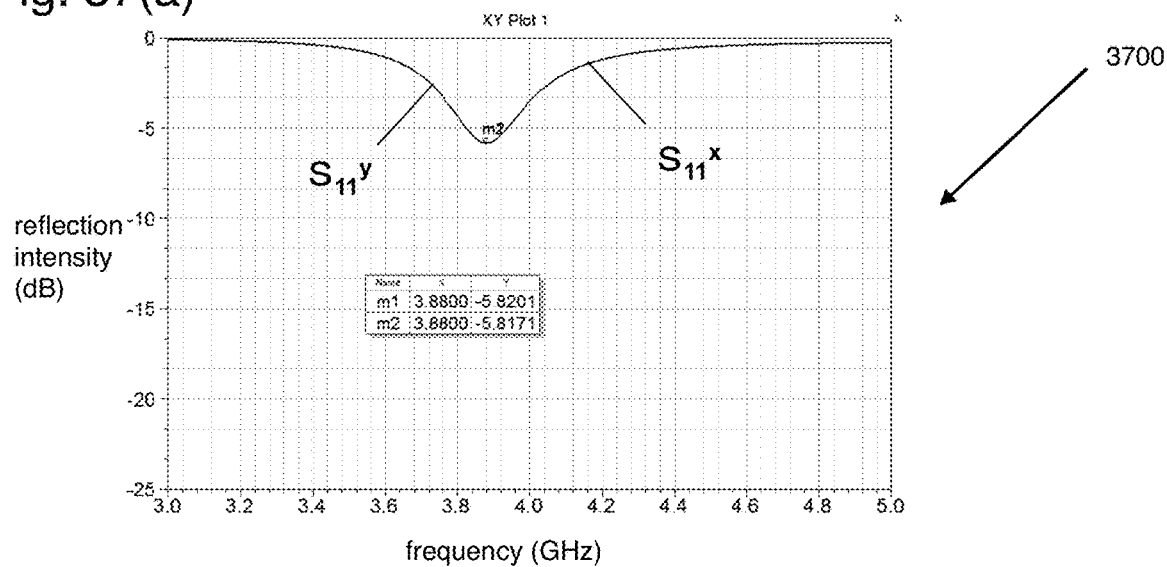
FIG. 37 (a) is a plot of reflection intensity versus frequency for an exemplary electromagnetic blocking structure according to FIG. 12 (a) in which the first conductor layer is a uniform layer of serpentine unit cells, and the second conductor layer is a uniform layer of loop unit cells in accordance with some embodiments.
Figure 37B:
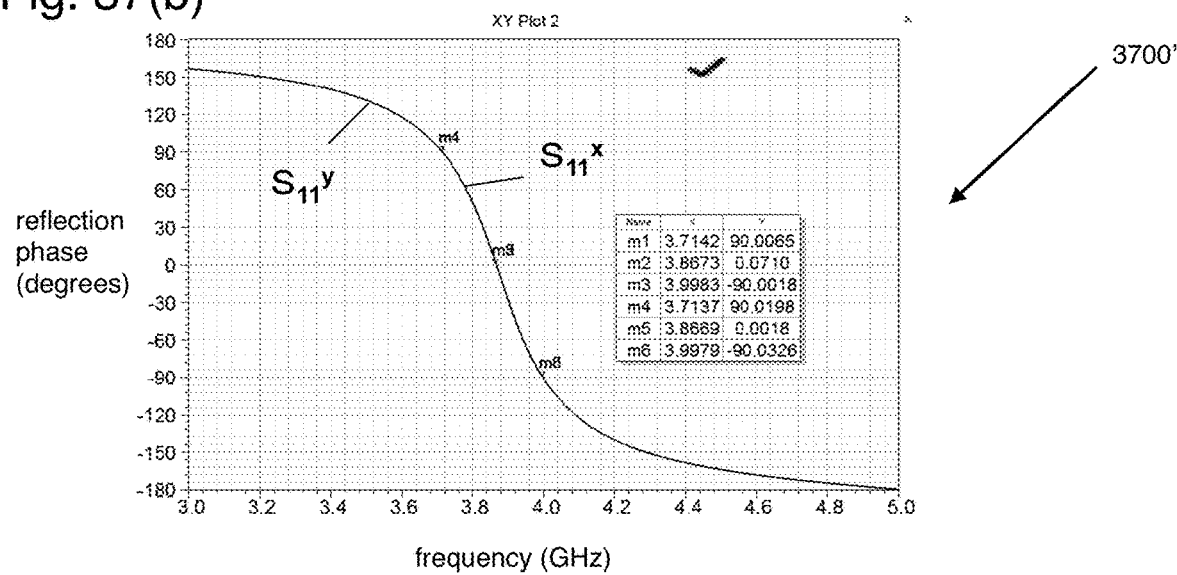

FIGS. 37 (a) and 37 (b) are plots of reflection intensity versus frequency and reflection phase versus frequency, respectively. Plots 3700 and 3700' were obtained based on a EM blocking structure having a structure similar to EM blocking structure 1200 wherein unit cells 725 and 730 are similar to unit cell 400 and unit cells 1235 are similar to unit cell 1000. Plots 3700 and 3700' were obtained using the finite element method described above.

Figure 38A:
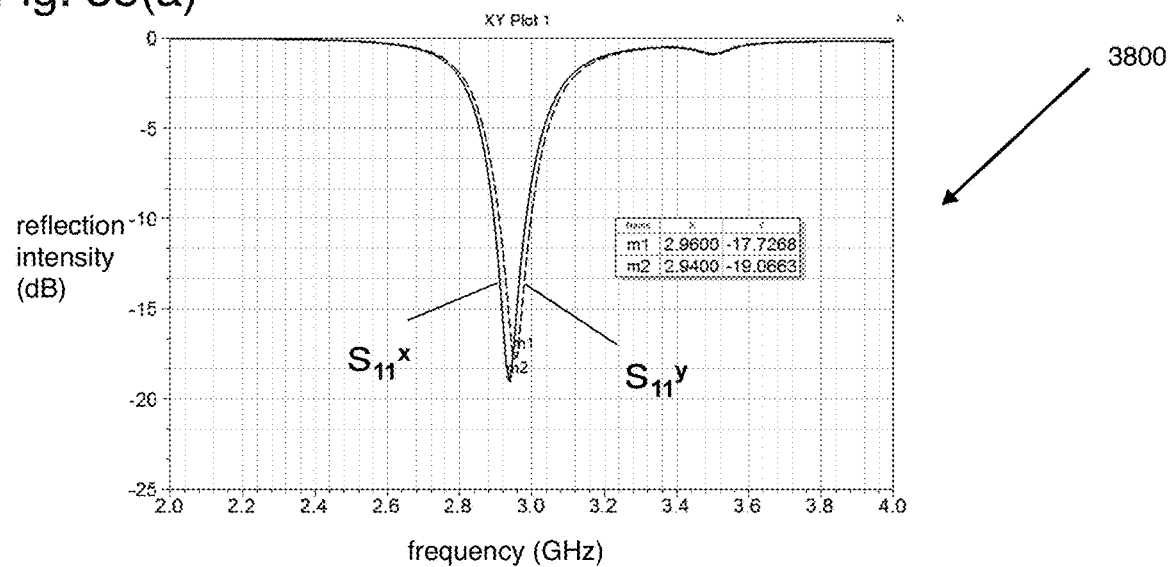
FIG. 38 (a) is a plot of reflection intensity versus frequency for an exemplary electromagnetic blocking structure according to FIG. 1 in which the first and second conductor layers are each uniform layers of serpentine unit cells, the first conductor layer having a pattern shown in FIG. 18 (a) and the second conductor layer having a pattern shown in FIG. 18 (b) in accordance with some embodiments.
Figure 38B:
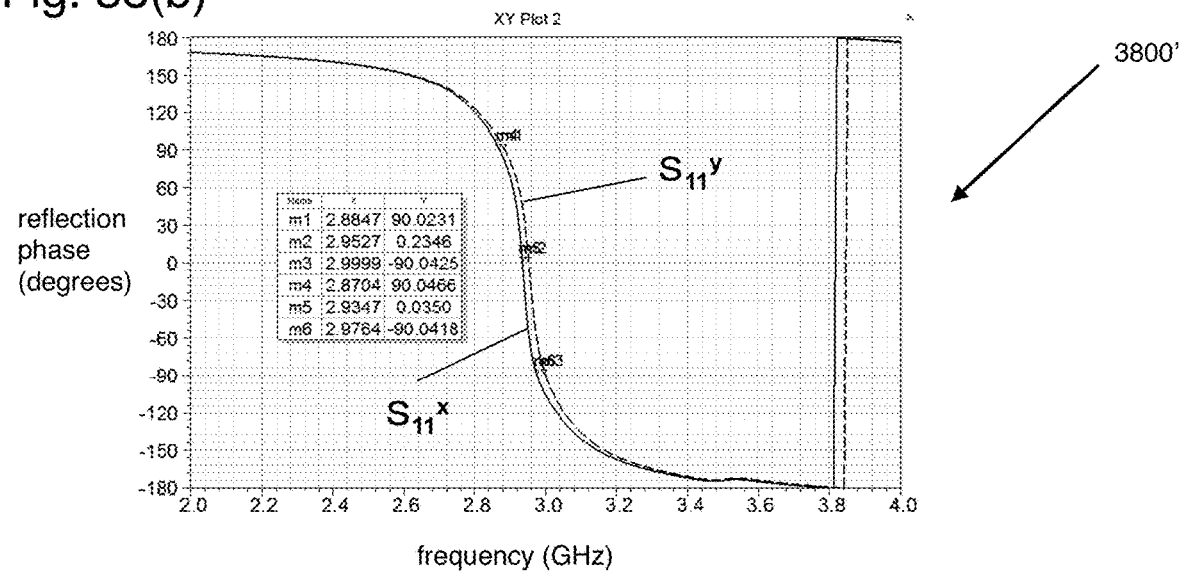

FIGS. 38 (a) and 38 (b) are plots of reflection intensity versus frequency and reflection phase versus frequency, respectively. Plots 3800 and 3800' were obtained based on a EM blocking structure having a structure similar to EM blocking structure 1200 wherein unit cells 725 and 735 are similar to unit cell 400 arranged similar to the pattern shown in layer 1820 of FIG. 18 (a), and unit cells 1235 of layer 1230 are serpentine unit cells 400 arranged similar to the pattern shown in layer 1830 of FIG. 18 (b). Plots 3800 and 3800' were obtained using the finite element method described above.

Figure 39:
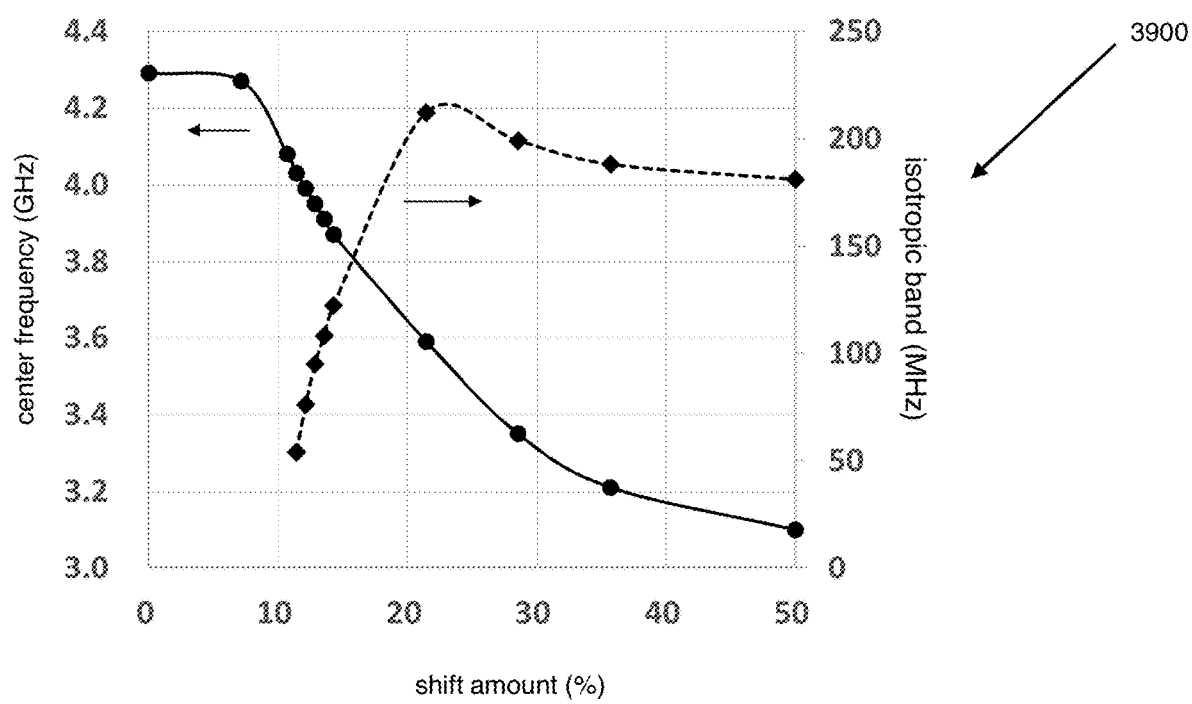
FIG. 39 is plot of center frequency and isotropic frequency band versus a shift amount expressed as a percentage of width of a unit cell of an exemplary electromagnetic blocking structure according to FIG. 12 (a) in which the first conductor layer is a uniform layer of serpentine unit cells, and the second conductor layer is a uniform layer of loop unit cells in accordance with some embodiments.
Figure 40A:
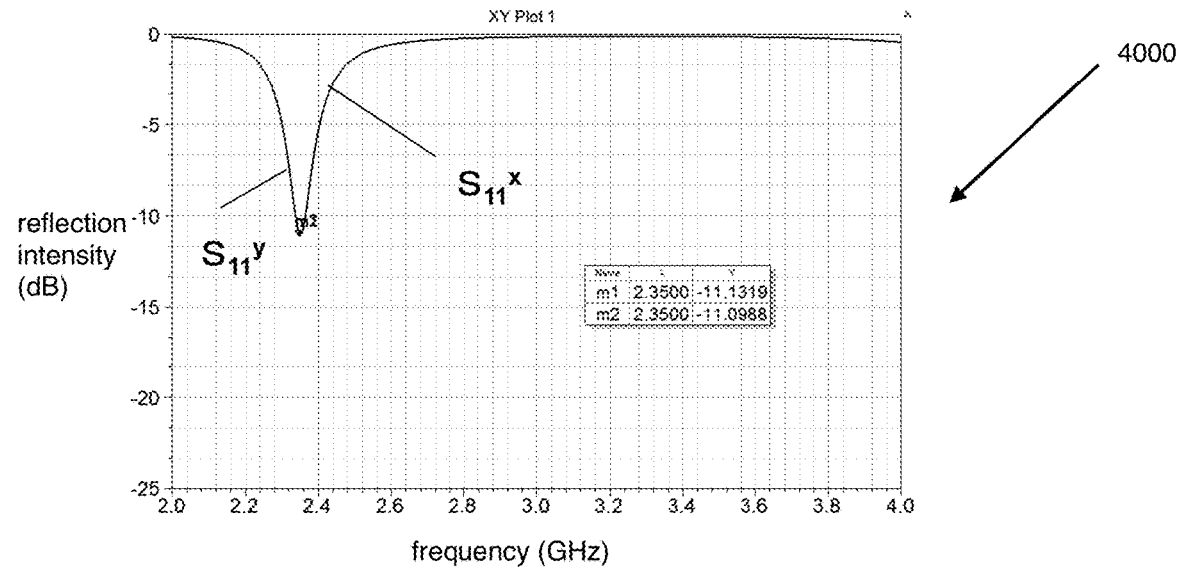
FIG. 40 (a) is a plot of reflection intensity versus frequency for an exemplary electromagnetic blocking structure according to FIG. 8 in which the first and second conductor layers are each uniform layers of point symmetric double spiral unit cells in accordance with some embodiments.
Figure 40B:
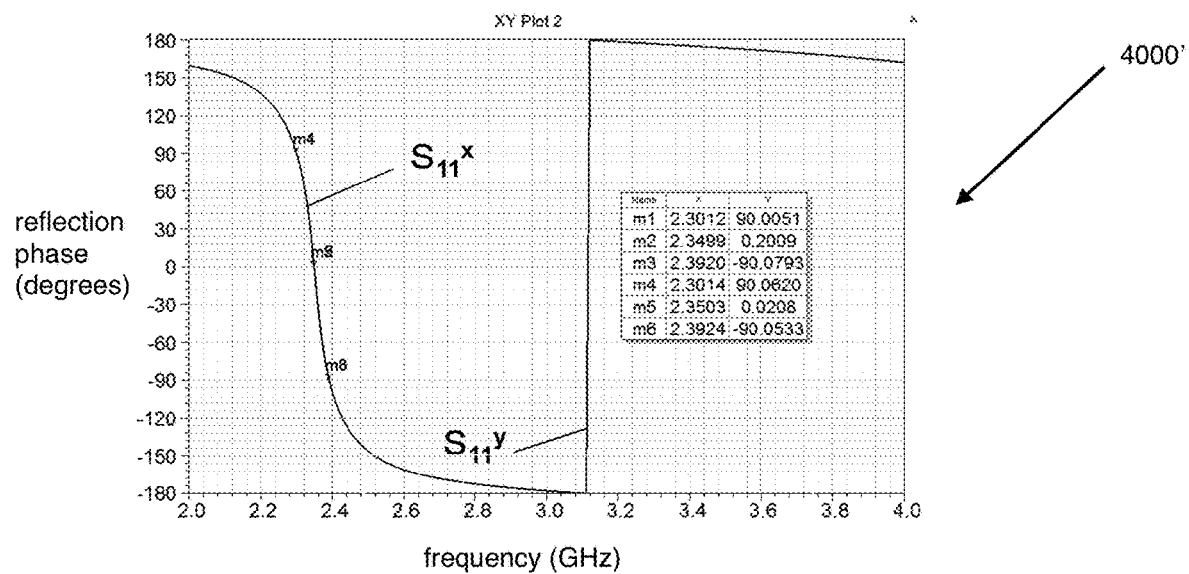

FIG. 39 is a plot expressing bandwidth indicative of center frequency and isotropy as a function of shift amount % between the first conductor layer 720 and the patch layer FIGS. 40 (a) and 40 (b) are plots of reflection intensity versus frequency and reflection phase versus frequency, respectively. Plots 4000 and 4000' were obtained based on a EM blocking structure having a structure similar to EM blocking structure 800 wherein unit cells 125 and 135 are similar to unit cell 400 and unit cells 845 are similar to unit cell 900. Plots 4000 and 4000' were obtained using the finite element method described above.

Figure 41A:
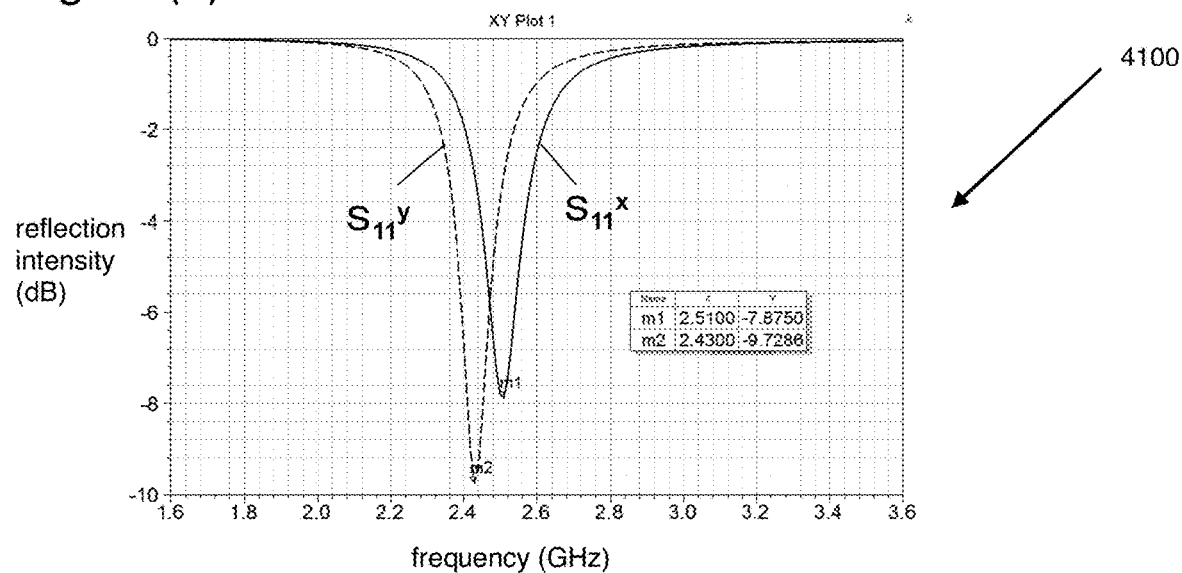
FIG. 41 (a) is a plot of reflection intensity versus frequency for an exemplary electromagnetic blocking structure according to FIG. 8 in which the first and second conductor layers are each uniform layers of serpentine unit cells, and the first conductor layer has the unit cell pattern shown in FIG. 19 (b) and the second conductor layer has the unit cell pattern shown in FIG. 19 (a) in accordance with some embodiments.
Figure 41B:
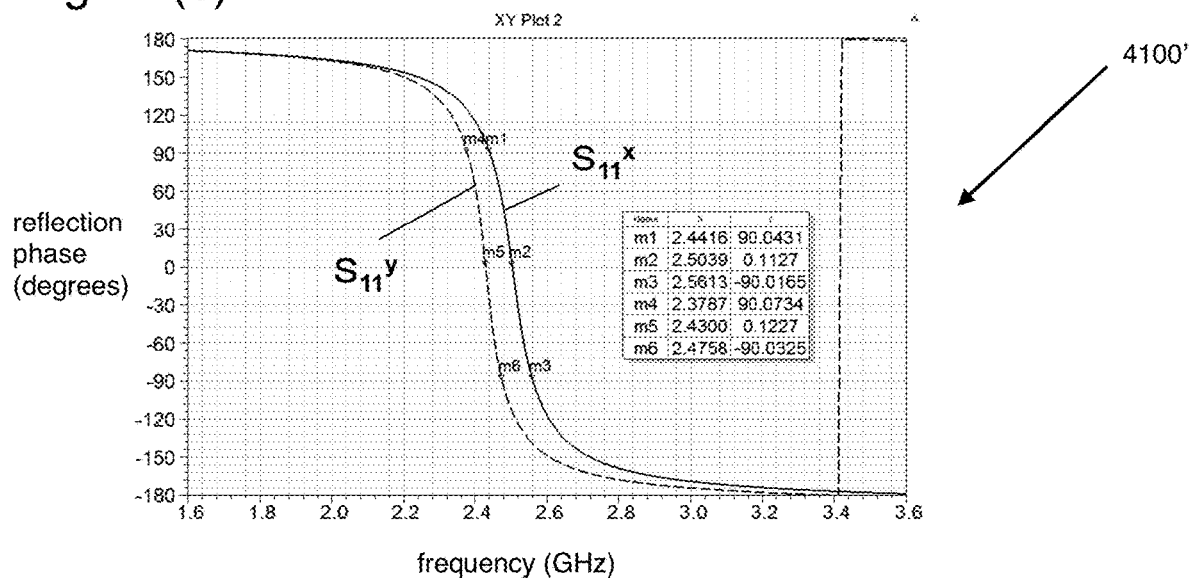

FIGS. 41 (a) and 41 (b) are plots of reflection intensity versus frequency and reflection phase versus frequency, respectively. Plots 4100 and 4100' were obtained based on a EM blocking structure having a structure similar to EM blocking structure 800 wherein unit cells 125 are similar to unit cell 400 in an arrangement similar to FIG. 19 (a), unit cells 135 similar to unit cell 400 and are in an arrangement similar to FIG. 19 (b), and the unit cells 845 are similar to unit cells 900 in a 2×2 arrangement. Plots 4100 and 4100' were obtained using the finite element method described above.

Figure 42A:
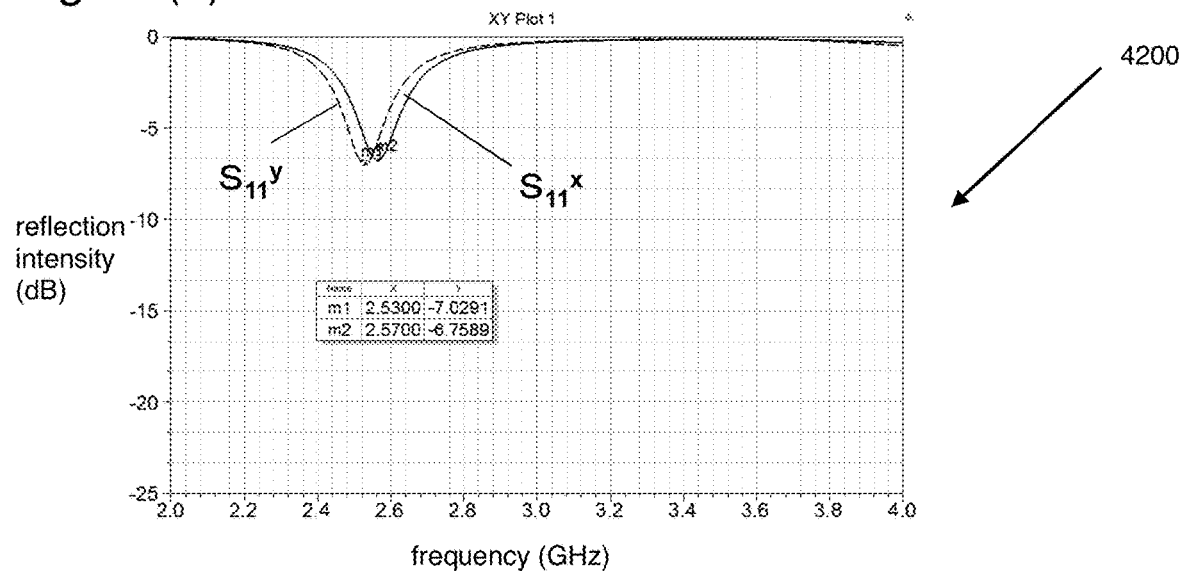
FIG. 42 (a) is a plot of reflection intensity versus frequency for an exemplary electromagnetic blocking structure according to FIG. 15 in accordance with some embodiments.
Figure 42B:
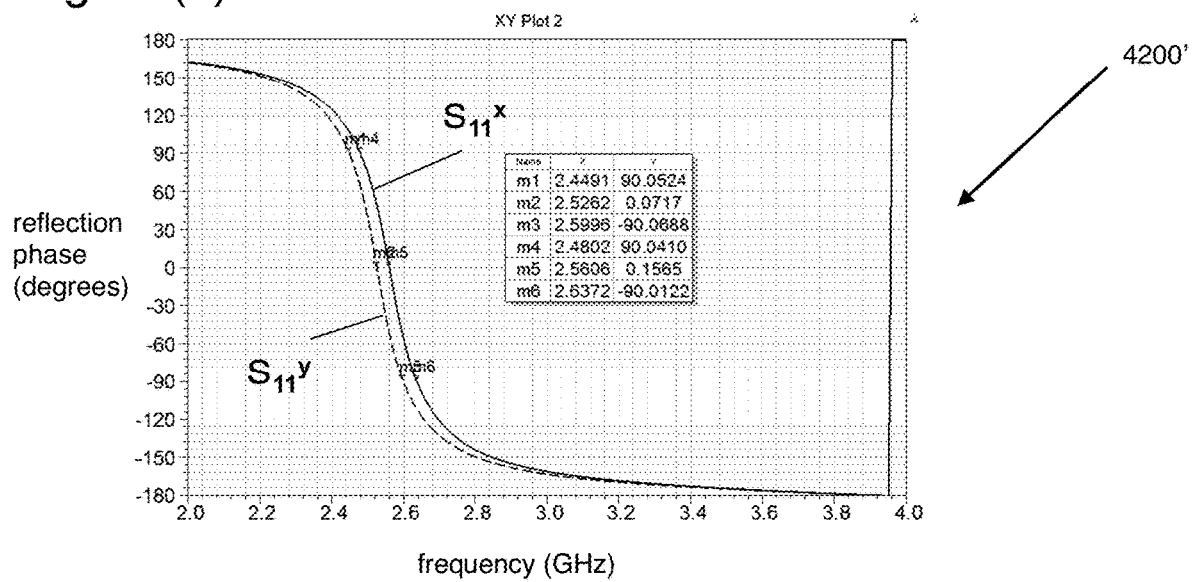

FIGS. 42 (a) and 42 (b) are plots of reflection intensity versus frequency and reflection phase versus frequency, respectively. Plots 4200 and 4200' were obtained based on an EM blocking structure having a structure similar to EM blocking structure 1500 wherein unit cells 125, 135, and 1525 are similar to unit cell 400. Plots 4200 and 4200' were obtained using the finite element method described above.

Table 2 (below) shows data obtained from simulations using the same finite element method as used with FIG. 20 (a) and (b), performed on an exemplary embodiment according to FIG. 15 in which various shift amount percentages ("shift amount %") which is the offset of the overlap of the unit cells of layers 120 and 1520 relative to layer 130 is expressed as a percent (%) of the width of a unit cell.

TABLE 2

| shift amount | x-direction frequency (GHz) | | | y-direction frequency (GHz) | | | dynamic band | result |
|---|---|---|---|---|---|---|---|---|
| (%) | +90° | 0° | −90° | +90° | 0° | −90° | (MHz) | |
| 50.0 | 2.873 | 2.949 | 3.016 | 2.852 | 2.924 | 2.987 | 114 | ○ |
| 48.2 | 2.866 | 2.941 | 3.008 | 2.842 | 2.913 | 2.975 | 109 | ○ |
| 46.8 | 2.853 | 2.927 | 2.992 | 2.833 | 2.903 | 2.963 | 110 | ○ |
| 42.9 | 2.837 | 2.909 | 2.972 | 2.815 | 2.882 | 2.941 | 104 | ○ |
| 35.7 | 2.960 | 3.038 | 3.106 | 2.940 | 3.013 | 3.076 | 116 | ○ |
| 28.6 | 3.007 | 3.082 | 3.146 | 2.991 | 3.061 | 3.119 | 112 | ○ |
| 21.4 | 3.254 | 3.333 | 3.397 | 3.234 | 3.307 | 3.363 | 109 | ○ |
| 14.3 | 3.433 | 3.498 | 3.544 | 3.340 | 3.457 | 3.494 | 61 | Δ |
| 10.7 | 3.606 | 3.655 | 3.682 | 3.575 | 3.612 | 3.626 | 20 | Δ |
| 7.1 | — | — | — | — | — | — | — | X |
| 0.0 | — | — | — | — | — | — | — | X |

What is claimed is:

1. An electromagnetic blocking structure, comprising:
a dielectric substrate;
first, second, and third conductor layers in the dielectric substrate; and at least one ground conductor layer, wherein
each of the first, second, and third conductor layers comprises a plurality of first unit cells of a first type without four-fold symmetry, arranged in a grid pattern,
each first unit cell among the plurality of first unit cells of the first and third conductor layers is oriented 90° relative to each first unit cell among the plurality of first unit cells of the second conductor layer,
each of the plurality of first unit cells of the first type is a serpentine structure, and
the first, second, and third conductor layers and the at least one ground conductor layer are arranged in the order of: the first conductor layer, the second conductor layer, the third conductor layer, and the at least one ground conductor layer.

2. The electromagnetic blocking structure of claim 1, further comprising an antenna element formed above a top surface of the dielectric substrate.

\* \* \* \* \*